(12) United States Patent
Hayashi et al.

(10) Patent No.: US 12,048,904 B2
(45) Date of Patent: Jul. 30, 2024

(54) ZEOLITE MEMBRANE COMPOSITE

(71) Applicant: MITSUBISHI CHEMICAL CORPORATION, Chiyoda-ku (JP)

(72) Inventors: Mikio Hayashi, Kanagawa (JP); Miki Yamada, Kanagawa (JP); Takahiko Takewaki, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 9 days.

(21) Appl. No.: 16/049,160

(22) Filed: Jul. 30, 2018

(65) Prior Publication Data

US 2018/0339272 A1    Nov. 29, 2018

Related U.S. Application Data

(63) Continuation of application No. 14/467,496, filed on Aug. 25, 2014, now abandoned, which is a (Continued)

(30) Foreign Application Priority Data

Feb. 24, 2012  (JP) ................................ 2012-039272
Aug. 31, 2012  (JP) ................................ 2012-192013

(51) Int. Cl.
B01D 71/02     (2006.01)
B01D 53/22     (2006.01)
(Continued)

(52) U.S. Cl.
CPC ....... B01D 71/0281 (2022.08); B01D 53/228 (2013.01); B01D 67/0051 (2013.01);
(Continued)

(58) Field of Classification Search
None
See application file for complete search history.

(56) References Cited

U.S. PATENT DOCUMENTS

| 5,554,286 A | 9/1996 | Okamoto et al. |
| 6,440,885 B1 | 8/2002 | Pierotti et al. |

(Continued)

FOREIGN PATENT DOCUMENTS

| CN | 1332671 | 1/2002 |
| CN | 102333584 | 1/2012 |

(Continued)

OTHER PUBLICATIONS

Office Action issued on Feb. 19, 2019 in Japanese Patent Application No. 2017-239737, 7 pages (with unedited computer generated English translation).

(Continued)

*Primary Examiner* — Bradley R Spies
*Assistant Examiner* — Jeannie McDermott
(74) *Attorney, Agent, or Firm* — Oblon, McClelland, Maier & Neustadt, L.L.P.

(57) ABSTRACT

A zeolite membrane composite for use in separation of a highly-permeative component through permeation from a vapor mixture or a liquid mixture comprising multiple components, the zeolite membrane composite comprising an inorganic porous support and a zeolite membrane provided thereon, wherein the zeolite membrane contains zeolite of a CHA-type aluminosilicate, and in a X-ray diffraction pattern obtained through irradiation to the zeolite membrane surface with X-ray, a peak intensity at around $2\theta=17.90$ has a value of less than 0.5 times a peak intensity at around $2\theta=20.80$ and a peak intensity at around $2\theta=9.6°$ has a value of 2.0 times or more and less than 4.0 times a peak intensity at around $2\theta=20.8°$.

13 Claims, 6 Drawing Sheets

Related U.S. Application Data continuation of application No. PCT/JP2013/054416, filed on Feb. 21, 2013.

(51) Int. Cl.

| | | |
|---|---|---|
| *B01D 67/00* | (2006.01) | |
| *B01D 69/02* | (2006.01) | |
| *B01D 69/12* | (2006.01) | |
| *C01B 39/48* | (2006.01) | |
| *C30B 7/10* | (2006.01) | |

(52) U.S. Cl.
CPC ........... *B01D 69/02* (2013.01); *B01D 69/125* (2013.01); *C01B 39/48* (2013.01); *C30B 7/10* (2013.01); *B01D 2053/221* (2013.01); *B01D 2323/24* (2013.01); *B01D 2323/40* (2013.01); *B01D 2325/12* (2013.01)

(56) References Cited

U.S. PATENT DOCUMENTS

| | | |
|---|---|---|
| 2003/0089227 A1 | 5/2003 | Hasse et al. |
| 2003/0136727 A1 | 7/2003 | Yamada et al. |
| 2004/0173094 A1 | 9/2004 | Nakayama et al. |
| 2005/0229779 A1 | 10/2005 | Nakayama et al. |
| 2009/0266237 A1 | 10/2009 | Serra Alfaro et al. |
| 2011/0160039 A1 | 6/2011 | Himeno et al. |
| 2012/0024777 A1 | 2/2012 | Sugita et al. |
| 2014/0360939 A1 | 12/2014 | Yamada et al. |

FOREIGN PATENT DOCUMENTS

| | | |
|---|---|---|
| EP | 2 402 071 A1 | 1/2012 |
| EP | 2 818 231 A1 | 12/2014 |
| JP | 7-185275 | 7/1995 |
| JP | 2000-237561 | 9/2000 |
| JP | 2003-144871 | 5/2003 |
| JP | 2004-105942 | 4/2004 |
| JP | 2005-503260 | 2/2005 |
| JP | 2008-520432 A | 6/2008 |
| JP | 2008-534272 A | 8/2008 |
| JP | 2011-105548 A | 6/2011 |
| JP | 2011-121040 | 6/2011 |
| JP | 2011-121045 | 6/2011 |
| JP | 2011-121854 | 6/2011 |
| JP | 2011-131174 A | 7/2011 |
| JP | 2012-236137 A | 12/2012 |
| WO | WO 2003-026780 | 4/2003 |
| WO | 2010098473 A1 | 9/2010 |
| WO | WO 2010-098473 | 9/2010 |
| WO | WO-2010098473 A1 * | 9/2010 ........... B01D 53/228 |

OTHER PUBLICATIONS

Decision of Refusal issued on Aug. 20, 2019 in Japanese patent application No. 2017-239737 (with unedited computer generated English translation).

International Search Report issued in PCT/JP2013/054416, Mar. 21, 2013.

Shiguang Li, et al.; Improved SAPO-34 Membranes for $Co_2/Ch_4$ Separations; Adv. Mater. 2006, 18, pp. 2601-2603.

Office Action issued Aug. 29, 2017 in Japanese Patent Application No. 2016-252076 (with unedited computer generated English translation).

European Office Action issued on Sep. 19, 2017 in Patent Application No. 13 852 525.9.

Halil Kalipcilar, et al.; Synthesis and Separation Performance of SSZ-13 Zeolite Membranes on Tubular Supports; Chem. Mater. 2002, 14, pp. 3458-3464.

Extended European Search Report issued Feb. 10, 2015 in Patent Application No. 13752525.9.

Chinese Office Action issued Jul. 20, 2015 in corresponding Chinese Patent Application No. 201380010140.0, filed Feb. 21, 2013.

Office Action issued Oct. 25, 2016 in Japanese Patent Application No. 2014-500935 (with machine English translation).

Yamanaka et al., Acid stability evaluation of CHA-type zeolites synthesized by interzeolite conversion of FAU-type zeolite and their membrane application for dehydration of acetic acid aqueous solutions, 158 Micropor. Mesopor. Mat. 141, 141-147 (2012).

Treacy et al, Collection of Simulated XRD Powder Patterns for Zeolite, Third Revised Edition, 1996, Elsevier, pp. 408-409.

Office Action issued on Apr. 1, 2020 in the corresponding Chinese patent application No. 201711120920.7 and machine translation thereof.

Office Action issued Feb. 22, 2021, in Chinese patent application No. 201711120920.7, with English translation (14 pages).

Office Action issued Jul. 28, 2021 in corresponding Chinese Patent Application No. 201711120920.7 (with English Translation), 16 pages.

* cited by examiner

[Fig. 1]
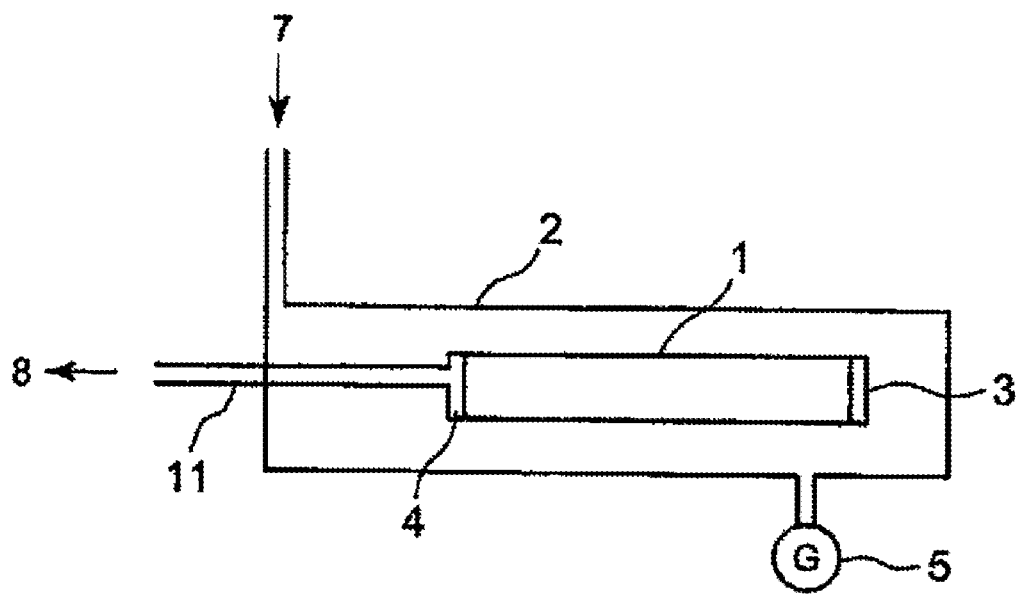
[Fig. 2]
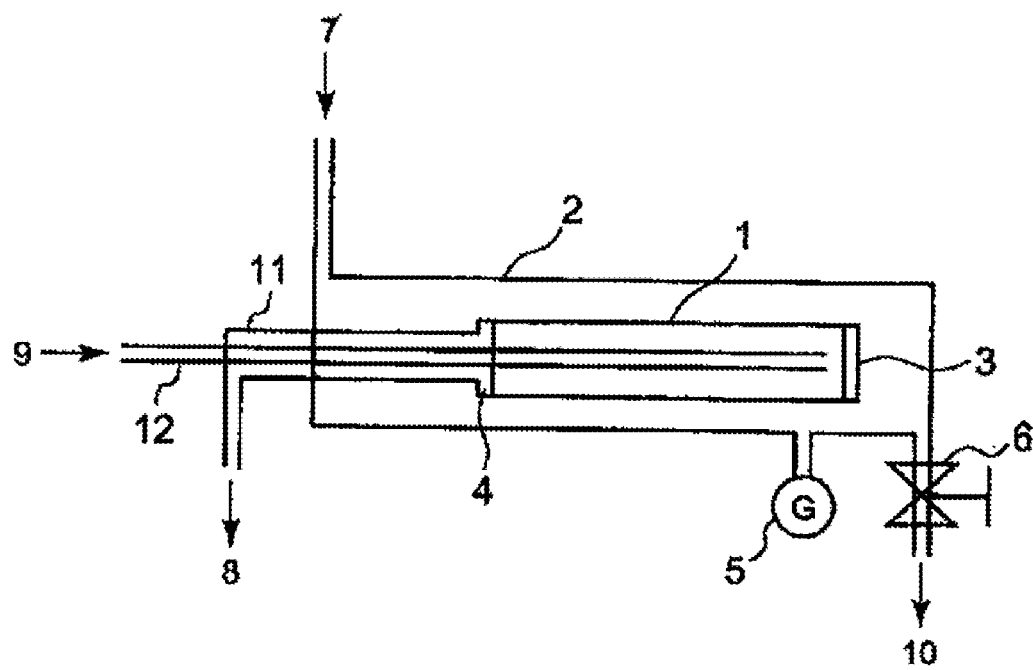

[Fig. 3]
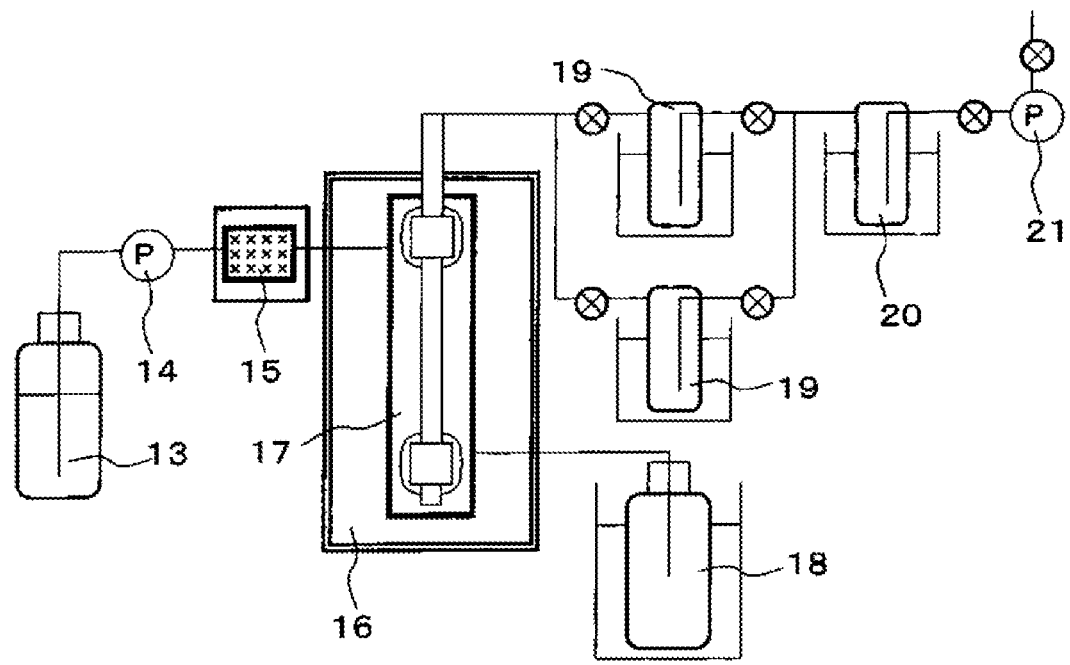

[Fig. 4]
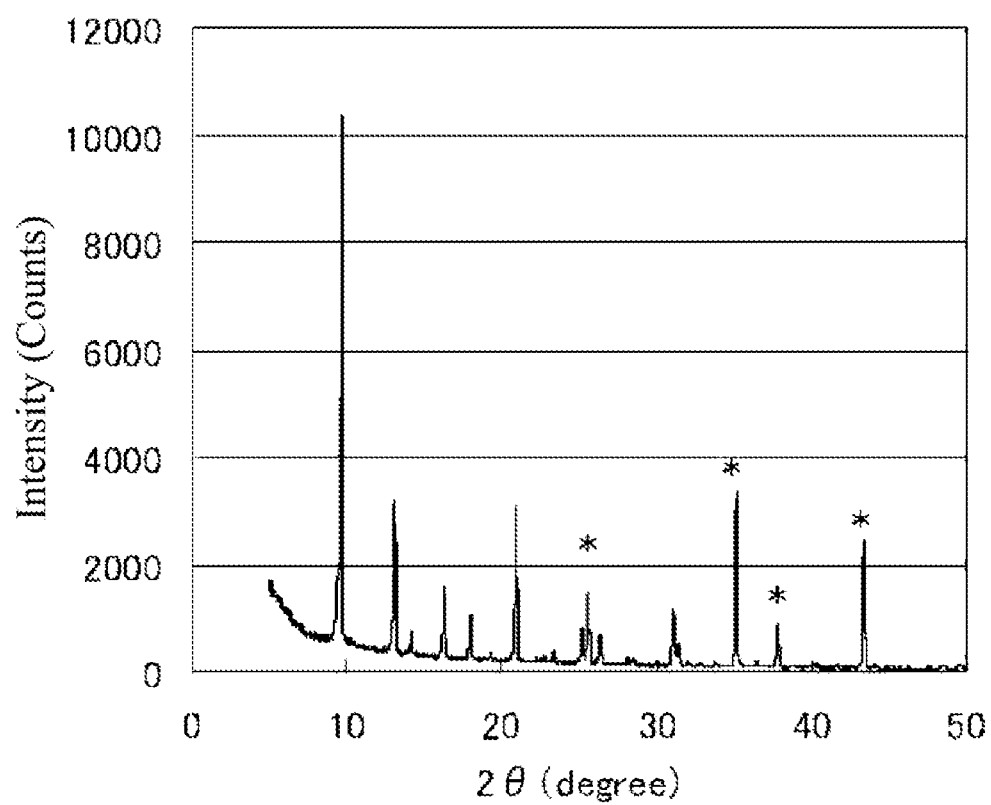

[Fig. 5]
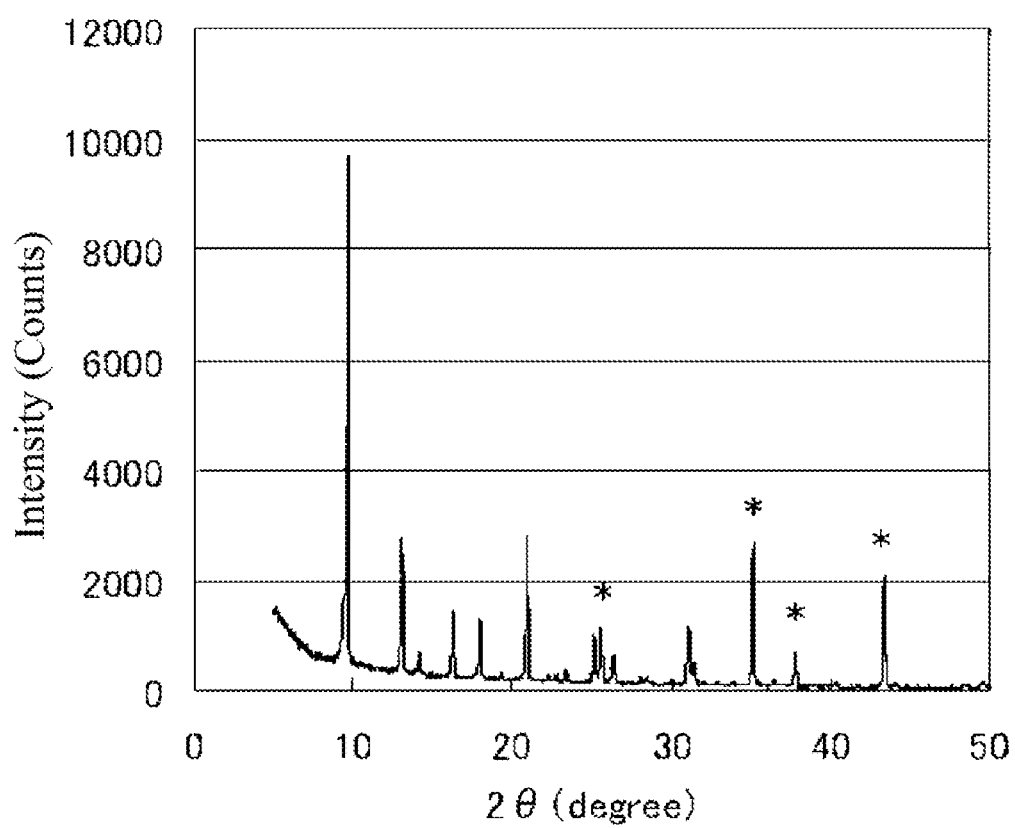

[Fig. 6]
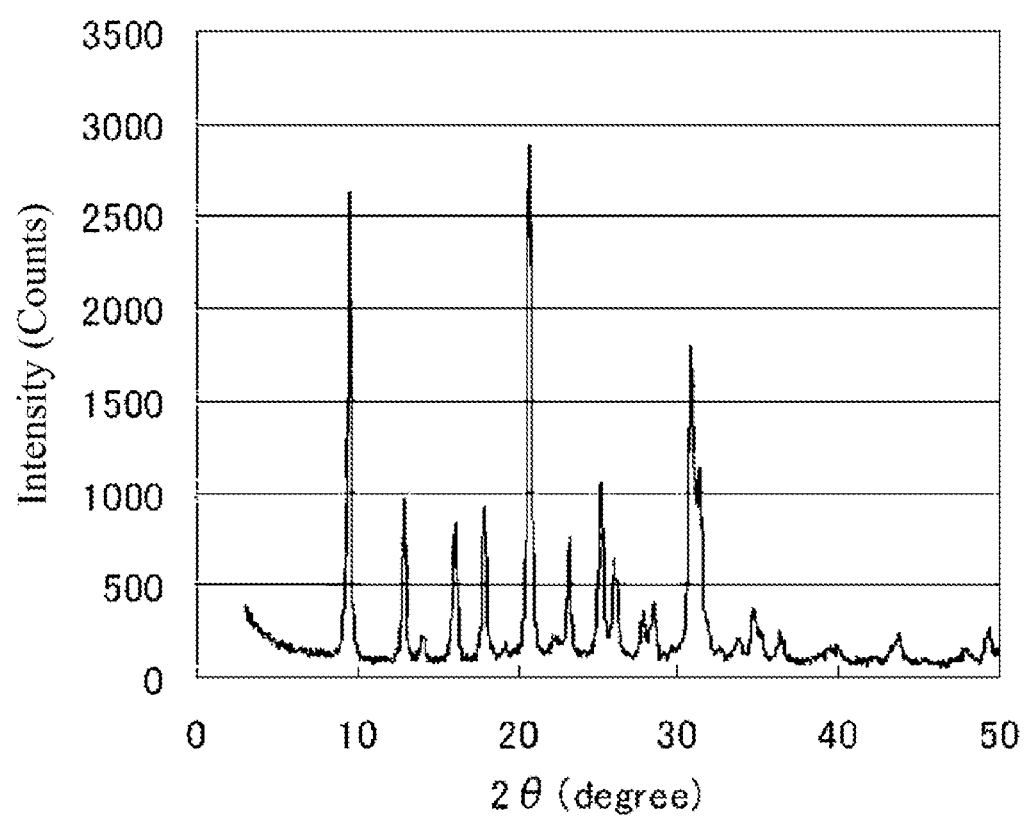

[Fig. 7]
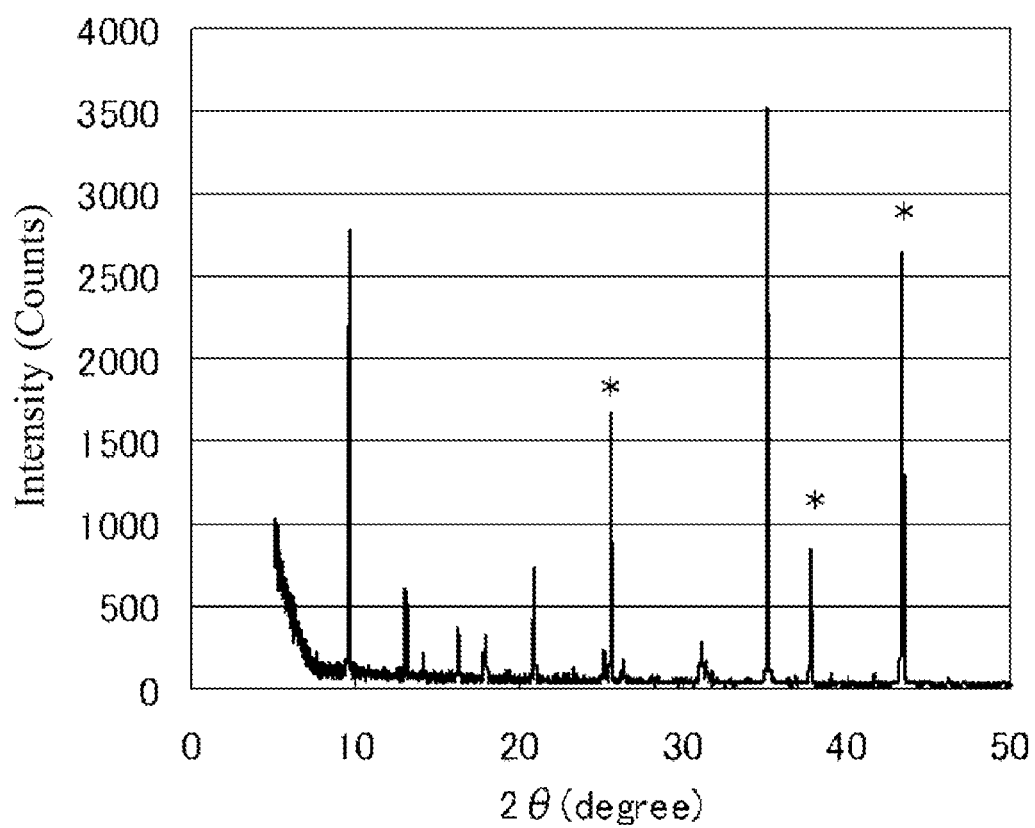

ZEOLITE MEMBRANE COMPOSITE

CROSS REFERENCE TO RELATED APPLICATIONS

The present application is a continuation of U.S. patent application Ser. No. 14/467,496, filed on Aug. 25, 2014, the entire disclosure of which is incorporated herein by reference and which is a continuation application of PCT/JP2013/054416, filed on Feb. 21, 2013, the entire disclosure of which is incorporated herein by reference and which claims priority to Japanese Patent Application Nos. JP 2012-039272, filed on Feb. 24, 2012, the entire disclosure of which is incorporated herein by reference, and JP 2012-192013, filed on Aug. 31, 2012, the entire disclosure of which is incorporated herein by reference.

TECHNICAL FIELD

The present invention relates to a zeolite membrane composite for use in separation of a specific component from a vapor mixture or a liquid mixture comprising multiple components, in which the zeolite membrane composite comprises a zeolite membrane having certain physical properties and formed on an inorganic porous support, and relates to a separation or concentration method that uses the zeolite membrane composite as a separating means for a vapor mixture or a liquid mixture.

BACKGROUND ART

Recently, as a separation method for a vapor (gaseous) or liquid mixture, there has been proposed a membrane separation/concentration method that uses a membrane such as a polymer membrane, a zeolite membrane or the like. A polymer membrane, for example, a flat membrane, a hollow fiber membrane or the like is excellent in workability but is defective in that the heat resistance thereof is poor. In addition, as poorly resistant to chemicals, many types of polymer membranes often swell especially in contact with an organic compound such as an organic solvent or an organic acid, and therefore the application range thereof to the subject to be separated or concentrated is limitative. A zeolite membrane is generally used for separation and concentration as a zeolite membrane composite having a filmy zeolite formed on a support. Separation and concentration using a membrane of an inorganic material can be carried out in a broader temperature range than that with a polymer membrane, and further the inorganic material membrane is applicable to separation of a mixture that contains an organic compound.

As a separation method for a vapor mixture (gas) by the use of a membrane, there has been proposed a method of using a polymer membrane since 1970's. However, a polymer membrane is excellent in workability but is, on the other hand, problematic in that it would deteriorate owing to heat, chemical substances or pressure and the performance thereof worsens. Recently, for solving these problems, there have been proposed various types of inorganic membranes having good chemical resistance, oxidation resistance, heat-resistant stability and pressure resistance. Among them, zeolite has regular sub-nanometer-order micropores, and therefore, as being able to work as a molecular sieve, zeolite can let specific molecules selectively pass therethrough, and is expected to exhibit high separation performance.

As concrete examples of membrane separation for a mixed gas, there is mentioned separation of carbon dioxide and nitrogen, carbon dioxide and methane, hydrogen and hydrocarbon, hydrogen and oxygen, hydrogen and carbon dioxide, nitrogen and hydrogen, paraffin and olefin or the like, as separation of gases to be discharged from thermal power plants, petrochemical industries, etc. As the zeolite membranes usable for gas separation, there are known zeolite membranes such as A-type membrane, FAU membrane, MFI membrane, SAPO-34 membrane, DDR membrane, etc.

A-type zeolite membrane is readily influenced by moisture and could hardly form a membrane with no crystal void, and the separation performance thereof is not high. In FAU membrane, zeolite micropores have a size of from 0.6 to 0.8 nm, and the size is such that two vapor molecules could pass through each zeolite micropore. This membrane is suitable for separation of molecules adsorbable to zeolite micropores and those not adsorbable thereto, for example, for separation of carbon dioxide and nitrogen. However, non-adsorbable molecules are difficult to separate and the application range of the membrane is therefore narrow. The pore size of MFI membrane is 0.55 nm, or that is, the pore size is somewhat large for separation of vapor molecules and the separation performance of the membrane is not high.

In purification plants for natural gas or in plants of biogas generation through methane fermentation of garbage or the like, it is desired to separate carbon dioxide and methane, and as zeolite membranes capable of favorably separating these, there are known high-performance membranes of DDR (PTL 1), SAPO-34 (NPL 1) and SSZ-13 (NPL 2) that utilize the molecular sieve function of zeolite.

As a separation method for a liquid mixture that uses a zeolite membrane, for example, there have been proposed a method of selective permeation of water using an A-type zeolite membrane composite for alcohol concentration (PTL 2), a method of selective permeation of water from a mixed system of alcohol and water by the use of a mordenite-type zeolite membrane composite for alcohol concentration (PTL 3), a method of selective permeation of water from a mixed system of acetic acid and water by the use of a ferrierite-type zeolite membrane composite for separation and concentration of acetic acid (PTL 4), etc.

CITATION LIST

Patent Literature

PTL 1: JP-A 2004-105942
PTL 2: JP-A 7-185275
PTL 3: JP-A 2003-144871
PTL 4: JP-A 2000-237561

Non-Patent Literature

NPL 1: Shiguang Li, et al., "Improved SAPO-34 Membranes for CO2/CH4 Separation", Adv. Mater. 2006, 18, 2601-2603.
NPL 2: Halil Kalipcilar, et al., "Synthesis and Separation Performance of SSZ-13 Zeolite Membranes on Tubular Supports", Chem. Mater. 2002, 14, 3458-3464

SUMMARY OF INVENTION

Technical Problem

However, for separation of a vapor mixture, DDR (PTL 1) has good separation performance, but the carbon dioxide permeance (permeability) thereof is low since the structure of zeolite is two-dimensional. On the other hand, SAPO-3 (NPL 1) that is a CHA-type aluminophosphate having a three-dimensional structure has good separation performance and permeance, but the performance thereof worsens in the presence of water. In chemical plants, moisture is often contained in a mixed gas in many cases, and SAPO-34 would be often impracticable.

Similarly, SSZ-13 (NPL 2) of a CHA-type aluminosilicate that is a membrane for a SUS support is insufficient in point of the separation performance thereof since there exist non-zeolite micropores (defects) in the zeolite membrane, and therefore the carbon dioxide permeance thereof is not also satisfactory. In this way, practicable separation membranes for vapor mixtures have heretofore been unknown.

For separation of liquid mixtures, for example, the mordenite-type zeolite membrane composite in PTL 3 and the ferrierite-type zeolite membrane composite in PTL 4 have a small permeation flux and are therefore insufficient in point of the throughput level for practical use. In addition, owing to promotion of dealumination under an acidic condition, the separation performance with the membrane composite may change with the prolongation of the operating time, and therefore using the membrane composite under the condition where an organic acid exists is undesirable. The A-type zeolite in PTL 2 does not have acid resistance and waterproofness, and the application range thereof is therefore limited.

On the other hand, the present inventors have found that, in forming a zeolite membrane on a porous support through hydrothermal synthesis, when a reaction mixture having a specific composition is used, then the crystal orientation of zeolite crystallizing on the support can better therefore providing a dense zeolite membrane that satisfies both sufficient throughput and good separation membrane performance in separation of a mixture of an organic compound and water, and have made previous proposals (WO2010/098473, JP-A 2011-121040, JP-A 2011-121045, JP-A 2011-121854). In case where the zeolite membrane composite is used for separation of a vapor or liquid mixture, both the throughput and the separation performance can be on a high level; however, especially in separation of a vapor mixture, in general, the amount of throughput is enormous and the necessary membrane area increases, though depending on the process scale. Consequently, for application to vapor mixture separation, the membrane is desired to secure a further increased throughput, or that is, to secure a further increased vapor permeance through the membrane. Also in liquid mixture separation, cost reduction and downsizing of apparatus are desired by further increasing the permeance and reducing the necessary membrane area.

The present invention addresses an object of providing a zeolite composite membrane which solves the prior-art problems, which is excellent in waterproofness and has high throughput and separation performance, and which has excellent characteristics in separation of a vapor mixture or a liquid mixture.

Solution to Problem

The present inventors have assiduously studied for the purpose of solving the above-mentioned problems and, as a result, have found that zeolite of a CHA-type aluminosilicate having certain physical properties can form a zeolite membrane composite that satisfies both sufficient throughput and separation processing performance enough for practical use and is favorable for a separation means for a vapor mixture and a liquid mixture. The present invention has been made on the basis of these findings.

Specifically, the gist of the invention resides in the following (1) to (19):

(1) A zeolite membrane composite for use in separation of a highly-permeative component through permeation from a vapor mixture or a liquid mixture comprising multiple components, the zeolite membrane composite comprising an inorganic porous support and a zeolite membrane provided thereon, wherein the zeolite membrane contains zeolite of a CHA-type aluminosilicate, and in a X-ray diffraction pattern obtained through irradiation to the zeolite membrane surface with X-ray, a peak intensity at around $2\theta=17.90$ has a value of less than 0.5 times a peak intensity at around $2\theta=20.8°$ and a peak intensity at around $2\theta=9.6°$ has a value of 2.0 times or more and less than 4.0 times a peak intensity at around $2\theta=20.8°$.

(2) The zeolite membrane composite according to the item (1), wherein a molar ratio of $SiO_2/Al_2O_3$ in the zeolite is 6 or more and 500 or less.

(3) The zeolite membrane composite according to the item (1) or (2), wherein a water adsorption of the zeolite membrane composite at a relative pressure of 0.8, as obtained from a water vapor adsorption isotherm of the zeolite membrane composite, is 2 times or more and 10 times or less a water adsorption thereof at a relative pressure of 0.2.

(4) A zeolite membrane composite for use in separation of a highly-permeative component through permeation from a vapor mixture or a liquid mixture comprising multiple components, the zeolite membrane composite comprising an inorganic porous support and a zeolite membrane provided thereon, wherein the zeolite membrane contains zeolite of a CHA-type aluminosilicate having a molar ratio of $SiO_2/Al_2O_3$ of 30 or more and 100 or less.

(5) The zeolite membrane composite according to the item (4), wherein in the X-ray diffraction pattern obtained through irradiation to the zeolite membrane surface with X-ray, a peak intensity at around $2\theta=17.9°$ has a value of less than 0.5 times a peak intensity at around $2\theta=20.8°$.

(6) The zeolite membrane composite according to the item (4) or (5), wherein in the X-ray diffraction pattern obtained through irradiation to the zeolite membrane surface with X-ray, a peak intensity at around $2\theta=9.6°$ has a value of 2.0 times or more and less than 4.0 times a peak intensity at around $2\theta=20.80$.

(7) The zeolite membrane composite according to any one of the items (4) to (6), wherein a water adsorption of the zeolite membrane composite at a relative pressure of 0.8, as obtained from a water vapor adsorption isotherm of the zeolite membrane composite, is 2 times or more and 10 times or less a water adsorption thereof at a relative pressure of 0.2.

(8) A zeolite membrane composite for use in separation of a highly-permeative component through permeation from a vapor mixture or a liquid mixture comprising multiple components, the zeolite membrane composite comprising an inorganic porous support and a zeolite membrane provided thereon, wherein the zeolite membrane contains zeolite of a CHA-type aluminosilicate, and a water adsorption of the zeolite membrane composite at a relative pressure of 0.8, as obtained from a water vapor adsorption isotherm of the zeolite membrane composite, is 2 times or more and 10 times or less a water adsorption thereof at a relative pressure of 0.2.

(9) The zeolite membrane composite according to the item (8), wherein in the X-ray diffraction pattern obtained through irradiation to the zeolite membrane surface with X-ray, a peak intensity at around 2θ=17.9° has a value of less than 0.5 times a peak intensity at around 2θ=20.8°.

(10) The zeolite membrane composite according to the item (8) or (9), wherein the zeolite membrane is such that, in the X-ray diffraction pattern obtained through irradiation of the membrane surface with X-rays, the peak intensity at around 2θ=9.6° has a value of 2.0 times or more and less than 4.0 times the peak intensity at around 2θ=20.80.

(11) The zeolite membrane composite according to any one of the items (8) to (10), wherein the zeolite has a molar ratio of $SiO_2/Al_2O_3$ of 6 or more and 500 or less.

(12) The zeolite membrane composite according to any one of the items (2), (4) to (7) and (11), wherein the zeolite has a molar ratio of $SiO_2/Al_2O_3$ of 30 or more and 50 or less.

(13) The zeolite membrane composite according to any one of the items (1) to (12), wherein an air permeation of the zeolite membrane composite as connected to a vacuum line under an absolute pressure of 5 kPa, is 100 L/(m²·h) or more and 1000 L/(m²·h) or less.

(14) The zeolite membrane composite according to any one of the items (1) to (13), wherein the zeolite membrane is formed by the use of a reaction mixture for hydrothermal synthesis that contains at least potassium (K) as the alkali source therein.

(15) The zeolite membrane composite according to any one of the items (1) to (14), which is a zeolite membrane composite for use in separation of a highly-permeative component through permeation from a vapor mixture comprising multiple components.

(16) The zeolite membrane composite according to any one of the items (1) to (14), which is a zeolite membrane composite for use in separation of a highly-permeative component through permeation from a liquid mixture comprising multiple components.

(17) A separation or concentration method for a vapor mixture, which comprises bringing a vapor mixture containing multiple vapor components into contact with the zeolite membrane composite as stated in any one of the items (1) to (15) to thereby separate a highly-permeative component through permeation from the vapor mixture, or to thereby separate a highly-permeative vapor component through permeation therefrom so as to concentrate a poorly-permeative vapor component.

(18) The method according to the item (17), wherein the vapor mixture contains at least one component selected from a group consisting of carbon dioxide, hydrogen, oxygen, nitrogen, methane, ethane, ethylene, propane, propylene, normal butane, isobutane, 1-butene, 2-butene, isobutene, sulfur hexafluoride, helium, carbon monoxide, nitrogen monoxide and water.

(19) A separation or concentration method for a liquid mixture, which comprises bringing a liquid mixture containing multiple components into contact with the zeolite membrane composite as stated in any one of the items (1) to (14) and (16) to thereby separate a highly-permeative component through permeation from the liquid mixture, or to thereby separate a highly-permeative component through permeation therefrom so as to concentrate a poorly-permeative component.

Advantageous Effects of the Invention

According to the invention, there is provided a zeolite membrane composite excellent in chemical resistance, heat-resistant stability, oxidation resistance and pressure resistance, especially securing a large permeation amount therethrough, having a high separation coefficient and high wet heat stability and having an excellent characteristic for separation of a vapor mixture or a liquid mixture.

Using the zeolite membrane composite of the invention as a separating means for a vapor mixture enables energy-saving, low-cost, high-performance and efficient vapor separation in small plants. Using the zeolite membrane composite of the invention as a separating means for a liquid mixture enables energy-saving, low-cost, high-performance and efficient separation of a highly-permeative substance from a liquid mixture containing organic compounds.

Also according to the invention, a highly-permeative component may be separated from a vapor mixture or a liquid mixture through permeation and a poorly-permeative vapor may be concentrated, whereby the highly-permeative component may be discharged out of the system and the poorly-permeative component may be concentrated and recovered and whereby the intended component can be separated at a high purity.

BRIEF DESCRIPTION OF DRAWINGS

FIG. 1 is a schematic view of an apparatus used in a gas permeation test.
FIG. 2 is a schematic view of an apparatus for use in gas separation.
FIG. 3 is a schematic view of an apparatus used in a vapor permeation method.
FIG. 4 is an XRD pattern of the CHA-type zeolite membrane produced in Example 1.
FIG. 5 is an XRD pattern of the CHA-type zeolite membrane produced in Example 2.
FIG. 6 is an XRD pattern of a powdery CHA-type zeolite.
FIG. 7 is an XRD pattern of the CHA-type zeolite membrane produced in Example 4.

DESCRIPTION OF EMBODIMENTS

Embodiments of the invention are described in more detail hereinunder. However, the description of the constituent features given below is for some examples of embodiments of the invention, and the invention is not limited by the contents thereof but can be carried out in various modifications within the spirit and the scope thereof. In this description, "zeolite membrane composite having a zeolite membrane formed on an inorganic porous support" may be referred to as "inorganic porous support-zeolite membrane composite". "Inorganic porous support-zeolite membrane composite" may be abbreviated as "zeolite membrane composite" or "membrane composite"; "inorganic porous support" may be as "support"; and "zeolite of a CHA-type aluminosilicate" may be as "CHA-type zeolite".

The zeolite membrane composite of the invention is a zeolite membrane composite for use in separation of a highly-permeative component through permeation from a vapor mixture or a liquid mixture comprising multiple components, wherein the zeolite membrane contains zeolite of a CHA-type aluminosilicate, in the X-ray diffraction pattern obtained through irradiation of the membrane surface with X-rays, the peak intensity at around 2θ=17.9° has a value of less than 0.5 times the peak intensity at around 2θ=20.80 and the peak intensity at around 2θ=9.6° has a value of 2.0 times or more and less than 4.0 times the peak intensity at around 2θ=20.8°, and the zeolite membrane is formed on an inorganic porous support.

The zeolite membrane composite of another aspect of the invention is a zeolite membrane composite for use in separation of a highly-permeative component through permeation from a vapor mixture or a liquid mixture comprising multiple components, wherein the zeolite membrane contains zeolite of a CHA-type aluminosilicate having a molar ratio of $SiO_2/Al_2O_3$ of 30 or more and 100 or less, and is formed on an inorganic porous support.

The zeolite membrane composite of still another aspect of the invention is a zeolite membrane composite for use in separation of a highly-permeative component through permeation from a vapor mixture or a liquid mixture comprising multiple components, wherein the zeolite membrane contains zeolite of a CHA-type aluminosilicate and is formed on an inorganic porous support, and wherein the water adsorption of the zeolite membrane composite at a relative pressure of 0.8, as obtained from the water vapor adsorption isotherm of the zeolite membrane composite, is 2 times or more and 10 times or less the water adsorption thereof at a relative pressure of 0.2.

In the invention, the zeolite membrane composite is, as described above, used as a membrane separating means for separation of a highly-permeative component through penetration from a vapor mixture or a liquid mixture of multiple components. The matters relating to the separation or concentration method such as the vapor component, the liquid component, the separation method, the separation performance and others will be described after the details of the zeolite membrane composite are described below.

<Zeolite Membrane Composite>
(Zeolite Membrane)

In the invention, the zeolite membrane contains zeolite having specific properties as described above, and the components constituting the zeolite membrane may contain, if desired, an inorganic binder such as silica, alumina or the like, an organic substance such as polymer or the like, as well as a silylating agent to modify the surface of zeolite and others, in addition to zeolite.

The zeolite membrane may partially contain an amorphous component or the like, but preferably, the zeolite membrane is composed of substantially zeolite alone.

The proportion of the CHA-type aluminosilicate contained in the zeolite membrane is generally at least 10% by volume, preferably at least 30% by volume, more preferably at least 60% by volume, even more preferably at least 80% by volume. Most preferably, the zeolite membrane is comprised of a CHA-type aluminosilicate alone, as excellent in gas permeability and separability.

Not specifically defined, the thickness of the zeolite membrane is generally at least 0.1 µm, preferably at least 0.6 µm, more preferably at least 1.0 µm, and is generally at most 100 m, preferably at most 60 µm, more preferably at most 20 µm. When the membrane thickness is too large, then the permeation amount may lower; and when too small, then the selectivity may lower and the membrane strength may lower.

The grain size of zeolite to form the zeolite membrane is not specifically defined; however, when too small, then the grain boundary would increase and the permeation selectivity would be thereby lowered. Consequently, the grain size is generally at least 30 nm, preferably at least 50 nm, more preferably at least 100 nm, and the upper limit thereof is not more than the thickness of the membrane. More preferred is a case where the grain size of zeolite is the same as the thickness of the membrane. When the grain size of zeolite is the same as the thickness of the membrane, then the grain boundary of zeolite could be the smallest. The zeolite membrane obtained through hydrothermal synthesis to be mentioned below is preferred since the grain size of zeolite could be the same as the thickness of the membrane.

The shape of the zeolite membrane is not specifically defined, for which is employable any and every shape including tubular, hollow-fiber, monolithic, honeycomb and the like shapes. The size is not also specifically defined. For example, in the case of a tabular membrane, in general, the preferred range for practical use thereof is such that the length is 2 cm or more and 200 cm or less, the inner diameter is 0.5 cm or more and 2 cm or less and the thickness is 0.5 mm or more and 4 mm or less.

(Zeolite)

In the invention, the zeolite membrane contains zeolite of a CHA-type aluminosilicate. Preferably, the zeolite to form the zeolite membrane is a CHA-type aluminosilicate. The aluminosilicate comprises Si and Al oxides as the main ingredients thereof, and may contain any other element not detracting from the advantageous effects of the invention.

In the invention, the molar ratio of $SiO_2/Al_2O_3$ in the aluminosilicate is not specifically defined, but is generally at least 6, preferably at least 10, more preferably at least 20, even more preferably at least 30, still more preferably at least 32, further more preferably at least 35, and especially more preferably at least 40. The upper limit is generally the amount of such a level that Al could be an impurity, and the molar ratio of $SiO_2/Al_2O_3$ is generally at most 500, preferably at most 100, more preferably at most 90, even more preferably at most 80, still more preferably at most 70, and most preferably at most 50. When the molar ratio of $SiO_2/Al_2O_3$ is less than the above lower limit, then the denseness of the zeolite membrane may lower and the durability thereof may also lower.

The molar ratio of $SiO_2/Al_2O_3$ may be adjusted according to the reaction condition of hydrothermal synthesis to be mentioned below.

The molar ratio of $SiO_2/Al_2O_3$ is a value obtained through scanning electron microscope-energy dispersive X-ray spectroscopy (SEM-EDX). In general, the measurement is attained at an X-ray accelerating voltage of 10 kV to give the information of the membrane alone having a thickness of a few microns.

(CHA-Type Zeolite)

In the invention, CHA-type zeolite is one having a CHA structure as the code to define the structure of zeolite, as stipulated by International Zeolite Association (IZA). The zeolite of the type has the same crystal structure as that of natural product, chabazite. The CHA-type zeolite has a structure characterized by having three-dimensional micropores composed of at most 8-membered oxygen rings having a diameter of 0.38×0.38 nm, and the structure is characterized by the X-ray diffraction data thereof.

The framework density $(T/nm^3)$ of the CHA-type zeolite is 14.5. The molar ratio of $SiO_2/Al_2O_3$ is the same as described above.

Here, the framework density $(T/nm^3)$ means the number of the other elements (T elements) than oxygen to constitute the framework per $nm^3$ (1000 $Å^3$) of zeolite, and the value is determined by the structure of zeolite. The relationship between the framework density and the zeolite structure is shown in ATLAS OF ZEOLITE FRAMEWORK TYPES Fifth Revised Edition 2001, ELSEVIER.

(Inorganic Porous Support)

The inorganic porous support may be any and every porous inorganic substance having chemical stability in such that zeolite can be crystallized as a membrane on the surface thereof. Concretely, for example, there are mentioned sintered ceramics of silica, α-alumina, γ-alumina, mullite, zirconia, titania, yttria, silicon nitride, silicon carbide or the like, sintered metals of iron, bronze, stainless or the like, glass, carbon compacts, etc.

Of inorganic porous supports, sintered ceramics have an effect of increasing the interfacial adhesiveness through partial zeolitation thereof during membrane production.

Further, an inorganic porous support containing at least one of alumina, silica and mullite is more preferred since partial zeolitation of the support is easy and since the bonding between the support and zeolite is thereby enhanced and a membrane having high separation capacity is easy to form.

The shape of the support is not specifically defined so far as the support secures effective separation of a vapor mixture or a liquid mixture. Concretely, for example, there are mentioned tabular, tubular, cylindrical, columnar or prismatic, honeycomb bodies or monolith bodies having many pores.

In the invention, a zeolite membrane is formed on the surface of an inorganic porous support, and preferably zeolite is crystallized as a membrane thereon.

The mean pore size that the support has is not specifically defined, but preferably the pore size of the support is controlled. The pore size is generally at least 0.02 μm, preferably at least 0.05 μm, more preferably at least 0.1 μm, and is generally at most 20 μm, preferably at most 10 μm, more preferably at most 5 am. When the mean pore size is too small, then the permeation amount would be low; but when too large, then the strength of the support itself would be insufficient and a dense zeolite membrane would be difficult to form on the support.

The mean pore size of the support may be measured according to a mercury intrusion method.

The surface of the support may be polished by filing or the like, if desired. The surface of the support means the surface part of the support on which a zeolite membrane is formed, and may be any surface area of the support having a different shape, and may also be multiple faces of the support. For example, in the case of a cylindrical tubular support, the surface thereof may be any of the outer surface and the inner surface or may also be both surfaces of the inner surface and the outer surface.

The porosity of the support is not specifically defined, and is not needed to be specifically controlled. In general, the porosity is preferably 20% or more and 60% or less. The porosity governs the permeation flow rate in vapor or liquid separation, and when the porosity is less than the lower limit, then the diffusion of the permeated matter would be interfered with; and when more than the upper limit, then the strength of the support would lower.

The porosity of the support may be measured according to a mercury intrusion method.

(Zeolite Membrane Composite)

The zeolite membrane composite is one where zeolite has firmly adhered to the surface of a support or the like and, as the case may be, preferred is one where a part of zeolite has firmly adhered even to the inside of the support.

As the zeolite membrane composite, for example, preferred is one where zeolite is crystallized as a membrane on the surface of a support of the like through hydrothermal synthesis thereon.

The position of the zeolite membrane on the support is not specifically defined. In a case of using a tubular support, a zeolite membrane may be attached to the outer surface thereof, or may be to the inner surface thereof, and further, depending on the system to which the membrane composite is applied, the zeolite membrane may be attached to both surfaces of the support. As the case may be the zeolite membrane may be laminated on the surface of a support, or zeolite may be crystallized so as to fill up the pores in the surface layer of the support. In this case, it is important that neither cracks nor continuous micropores exist inside the crystallized membrane layer, and formation of a so-called dense membrane results in improvement of separability.

The zeolite membrane composite of the invention is preferably such that, in the X-ray diffraction pattern obtained through irradiation of the membrane surface with X-rays, the peak intensity at around $2\theta=17.9°$ is less than 0.5 times the peak intensity at around $2\theta=20.80$.

Here, the peak intensity indicates one to be calculated by subtracting the background value from the measured value. The peak intensity ratio represented by (peak intensity at around $2\theta=17.9°$)/(peak intensity at around $2\theta=20.8°$) (hereinafter this may be referred to as "peak intensity ratio A") is generally less than 0.5, preferably at most 0.45. Not specifically defined, the lower limit is generally at least 0.001.

Also in the invention, the zeolite membrane composite is preferably such that, in the X-ray diffraction pattern, the peak intensity at around $2\theta=9.6°$ is 2.0 times or more and less than 4.0 times the peak intensity at around $2\theta=20.80$.

The above means that the peak intensity ratio represented by (peak intensity at around $2\theta=9.6°$)/(peak intensity at around $2\theta=20.8°$) (hereinafter this may be referred to as "peak intensity ratio B") is generally at least 2.0, preferably at least 2.1, more preferably at least 2.3, even more preferably at least 2.5. The upper limit is generally less than 4.0, preferably at most 3.9, more preferably at most 3.7, even more preferably at most 3.5.

Here, the X-ray diffraction pattern is drawn through irradiation of the surface to which zeolite mainly adheres, with X-rays from a ray source of CuKα followed by scanning with a scan axis of θ/2θ. The shape of the sample to be analyzed may be any one of which the surface of the membrane composite having zeolite mainly adhering thereto could be irradiated with X rays, and as one example thereof capable of well expressing the characteristic feature of the membrane composite, preferred is the membrane composite itself just after its production or one prepared by cutting the produced membrane composite into a suitable size that is restricted by apparatus.

Here, in case where the surface of the zeolite membrane composite is a curved one, the membrane composite of the type may be analyzed to give the X-ray diffraction pattern thereof, while using an automatic variable slit and while fixing the irradiation width. The X-ray diffraction pattern in the case of using an automatic variable slit indicates a pattern with variable to stationary slit correction.

Here, the peak at around $2\theta=17.9°$ indicates the maximum peak of those existing in the range of $17.9°\pm0.60$ among the peaks not assigned to the substrate.

The peak at around $2\theta=20.8°$ indicates the maximum peak of those existing in the range of $20.80\pm0.60$ among the peaks not assigned to the substrate.

The peak at around $2\theta=9.6°$ indicates the maximum peak of those existing in the range of $9.6°\pm0.60$ among the peaks not assigned to the substrate.

According to COLLECTION OF SIMULATED XRD POWDER PATTERNS FOR ZEOLITE, Third Revised Edition, ELSEVIER (1996), and assuming that the space group using rhombohedral setting is:

$$R\bar{3}m \qquad \text{[Math. 1]}$$

(No. 166), the peak at around 2θ=9.6° in the X-ray diffraction pattern is a peak assigned to the plane with an index of (1,0,0) in the CHA structure.

Also, according to COLLECTION OF SIMULATED XRD POWDER PATTERNS FOR ZEOLITE, Third Revised Edition, ELSEVIER (1996), and assuming that the space group using rhombohedral setting is:

$$R\overline{3}m \qquad \text{[Math. 2]}$$

(No. 166), the peak at around 2θ=17.9° in the X-ray diffraction pattern is a peak assigned to the plane with an index of (1,1,1) in the CHA structure.

According to COLLECTION OF SIMULATED XRD POWDER PATTERNS FOR ZEOLITE, Third Revised Edition, ELSEVIER (1996), and assuming that the space group using rhombohedral setting is:

$$R\overline{3}m \qquad \text{[Math. 3]}$$

(No. 166), the peak at around 2θ=20.8° in the X-ray diffraction pattern is a peak assigned to the plane with an index of (2,0,-1) in the CHA structure.

According to NPL 2, the typical ratio of the (1,0,0) plane-derived peak intensity to the (2,0,-1) plane-derived peak intensity in the CHA-type aluminosilicate zeolite membrane (peak intensity ratio B) is less than 2.

Consequently, it is considered that the ratio of 2.0 or more and less than 4.0 could mean that the zeolite crystal has grown while aligned in a moderate degree in such a manner that the (1,0,0) plane of the CHA structure to be, for example, rhombohedral setting could be nearly parallel to the surface of the membrane composite. In the zeolite membrane composite, growing the zeolite crystal while aligned is advantageous in that a dense membrane having high separation performance can be formed.

Here, the alignment in a moderate degree means that crystals of which the (1,0,0) planes have aligned nearly parallel to the surface of the membrane composite accounts for a moderate proportion of all crystals, and the proportion is larger than that in a powdery CHA-type aluminosilicate or the like in which the crystals align at random, and is smaller than that in a zeolite membrane of a CHA-aluminosilicate in which the (1,0,0) planes of most crystals have aligned nearly in parallel to the membrane composite surface and of which the peak intensity ratio B is 4 or more.

According to NPL 2, the typical peak of the (1,1,1) plane-derived peak intensity to the (2,0,-1) plane-derived peak intensity in the CHA-type aluminosilicate zeolite membrane (peak intensity ratio A) is less than 0.5.

Consequently, it is considered that the ratio of less than 0.5 could mean that the zeolite crystals have poorly grown while aligned in such a manner that the (1,1,1) plane of the CHA structure to be, for example, rhombohedral setting could be nearly parallel to the surface of the membrane composite.

Here, the zeolite crystals having poorly grown while aligned in that manner mean that the proportion of the zeolite crystals of which the (1,1,1) planes have aligned nearly in parallel to the surface of the membrane composite to all the crystals is small, or that is, the (1,1,1) planes of the crystals face almost at random.

As in the above, the case where any of the peak intensity ratio A or B is a value falling within the above-mentioned specific range means that the zeolite crystals have grown while aligned in a moderate degree to thereby provide a dense membrane having high separation performance.

The dense zeolite membrane in which CHA-type zeolite crystals have grown while aligned in a moderate degree may be attained according to thermal synthesis to give a zeolite membrane, in which, for example, a specific organic template is preferably used and in which $K^+$ ions are made to exist in the aqueous reaction mixture, as described below.

Also in the invention, it is desirable that the water adsorption of the zeolite membrane composite at a relative pressure of 0.8, as obtained from the water vapor adsorption isotherm of the zeolite membrane composite, is 2 times or more and 10 times or less the water adsorption thereof at a relative pressure of 0.2.

Here, the adsorption isotherm is a graph showing the adsorption change relative to pressure at a constant temperature of material. In this, in general, the horizontal axis indicates the relative pressure derived by dividing the equilibrium pressure by the saturated vapor pressure ($P/P_0$), which takes a value of from 0 to 1. In the invention, the water (water vapor) adsorption (g/g) of the zeolite composite membrane at a relative pressure of 0.8 and that at a relative pressure 0.2 are referred to as indices.

As described above, of the zeolite membrane composite of the invention, the ratio of the water absorption at a relative pressure of 0.8 to the water absorption thereof at a relative pressure of 0.2 is preferably 2 or more and 10 or less, and the value is more preferably 2.1 or more, even more preferably 2.2 or more, and is more preferably 8 or less, even more preferably 5 or less.

The value is generally correlated with water adsorption to the meso pores in a zeolite membrane, and the larger value means that the hydrophilic meso pore volume tends to be large, while the smaller value means that the hydrophilic meso pore volume tends to be small. The membrane of which the value is too large is often a membrane in which a large number of mesopores exist and which therefore has a small density, and accordingly, the membrane of the type tends to be a membrane having low separation performance; while on the other hand, the membrane of which the value is too small is often a membrane in which few mesopores exist and which therefore has a high density, and the membrane of the type tends to be a membrane having high separation performance but having a low permeation amount therethrough. When the value is 2 or more and 10 or less, then it becomes possible to provide a membrane having good separation performance and having a high permeation amount therethrough.

<Production Method for Zeolite Membrane Composite>

In the invention, the production method for the zeolite membrane is not specifically defined so far as the method realizes formation of the above-mentioned specific zeolite membrane on a support. For example, there are mentioned (1) a method of crystallizing zeolite on a support as a membrane thereon, (2) a method of firmly fixing zeolite to a support by an inorganic binder, an organic binder or the like, (3) a method of firmly fixing a zeolite-dispersed polymer thereto, (4) a method of firmly fixing zeolite to a support by dipping a support in a slurry of zeolite optionally followed by suction, etc., and any of these methods is employable here. According to these methods, there can be obtained an inorganic porous support-zeolite membrane composite.

Of those, especially preferred is a method of crystallizing zeolite on an inorganic porous support as a membrane thereon. The crystallization method is not specifically defined. Preferred is a method of putting a support into a reaction mixture for hydrothermal synthesis for zeolite production (hereinafter this may be referred to as "aqueous reaction mixture") followed by direct hydrothermal synthesis to thereby crystallize zeolite on the surface of the support, etc.

Concretely, for example, an aqueous reaction mixture of which the composition has been prepared and homogenized is put into a heat-resistant and pressure-tight container such as an autoclave or the like in which a support has been gently fixed therein, then airtightly sealed up and heated for a predetermined period of time.

As the aqueous reaction mixture, preferred is one containing an Si element source, an Al element source, an alkali source and water, and optionally containing an organic template.

The Si element source to be used for the aqueous reaction mixture includes, for example, amorphous silica, colloidal silica, silica gel, sodium silicate, amorphous aluminosilicate gel, tetraethoxysilane (TEOS), trimethylethoxysilane, etc.

The Al element source includes, for example, sodium aluminate, aluminium hydroxide, aluminium sulfate, aluminium nitrate, aluminium oxide, amorphous aluminosilicate gel, etc. The mixture may additionally contain any other element source than the Al element source, for example, an element source of Ga, Fe, B, Ti, Zr, Sn, Zn or the like.

The type of alkali for use in the alkali source is not specifically defined, for which employable are an alkali metal hydroxide and an alkaline earth metal hydroxide.

The metal species of the metal hydroxide generally includes Na, K, Li, Rb, Cs, Ca, Mg, Sr, Ba, etc. Preferred are Na and K, and more preferred is K. Two or more different types of metal species may be used for the metal hydroxide. Concretely, preferred is a combination of Na and K, or a combination of Li and K.

Concretely, as the alkali source, for example, employable here are alkali metal hydroxides such as sodium hydroxide, potassium hydroxide, lithium hydroxide, rubidium hydroxide, cesium hydroxide, etc.; alkaline earth metal hydroxides such as calcium hydroxide, magnesium hydroxide, strontium hydroxide, barium hydroxide, etc.

As the alkali source for use in the aqueous reaction mixture, usable are hydroxide ions of counter anions of organic template to be mentioned next.

In crystallization of zeolite, if desired, an organic template (structure directing agent) may be used, and preferred here is one synthesized by the use of an organic template. Synthesizing by the use of an organic template increases the ratio of the silicon atom relative to the aluminium atom in the crystallized zeolite and therefore enhances the crystallinity of the zeolite.

Not specifically defined in point of the type thereof, the organic template may be any one capable of forming a desired zeolite membrane. One alone or two or more different types of templates may be used here either singly or as combined. In general, amines or quaternary ammonium salts are usable as the organic template. For example, preferred are the organic templates described in U.S. Pat. No. 4,544,538 and US Patent Application Publication 2008/0075656.

Concretely, for example, there are mentioned cations derived from alicyclic amines, such as cations derived from 1-adamantanamine, cations derived from 3-quinacridinal, cations derived from 3-exo-aminonorbornene, etc. Of those, more preferred are cations derived from 1-adamantanamine. When a cation derived from 1-adamantanamine is used as the organic template here, a CHA-type zeolite capable of forming a dense membrane may crystallize.

Of the cations derived from 1-adamantanamine, more preferred is an N,N,N-trialkyl-1-adamantanammonium cation. In general, the three alkyl groups of the N,N,N-trialkyl-1-adamantanammonium cation are alkyl groups independent of each other, and are preferably lower alkyl groups, more preferably methyl groups. Of the above, the most preferred compound is N,N,N-trimethyl-1-adamantanammonium cation.

The cation of the type is accompanied by an anion not causing any harm to the formation of CHA-type zeolite. Typical examples of the anion of the type include halide ions such as $Cl^-$, $Br^-$, $I^-$, etc.; as well as hydroxide ion, acetate, sulfate, and carboxylate. Of those, especially preferred for use here is a hydroxide ion, and the halide ion may function as an alkali source as described above.

As other organic templates, also usable are N,N,N-trialkylbenzylammonium cations. Also in the case, the alkyl groups are independent of each other, and are preferably lower alkyl groups, more preferably methyl groups. Of the above, the most preferred compound is N,N,N-trimethylbenzylammonium cation. The anion accompanied by the cation is the same as above.

The ratio of the Si element source and the Al element source in the aqueous reaction mixture is generally expressed as the molar ratio of oxides of the respective elements, or that is, as the molar ratio of $SiO_2/Al_2O_3$.

The ratio of $SiO_2/Al_2O_3$ is not specifically defined, so far as the ratio could enable formation of zeolite having the above-mentioned ratio of $SiO_2/Al_2O_3$. The ratio is generally at least 5, preferably at least 20, more preferably at least 30, even more preferably at least 40, especially preferably at least 50. The upper ratio of the ratio is generally at most 500, preferably at most 200, more preferably at most 150, even more preferably at most 140. When the ratio of $SiO_2/Al_2O_3$ falls within the range, zeolite of a CHA-type aluminosilicate capable of forming a dense membrane can be crystallized.

The ratio of the silica source and the organic template in the aqueous reaction mixture is, as the ratio by mol of organic template to $SiO_2$ (molar ratio of organic template/$SiO_2$), generally at least 0.005, preferably at least 0.01, more preferably at least 0.02, and is generally at most 1, preferably at most 0.4, more preferably at most 0.2. When the ratio falls within the range, then a dense zeolite membrane can be formed and, in addition thereto, the formed zeolite has strong acid resistance and Al is hardly released therefrom. Further, under the condition, an especially dense and acid-resistant CHA-type aluminosilicate zeolite can be formed.

The ratio of Si element source and the metal hydroxide is, as the ratio by mol of $M_{(2/n)}O/SiO_2$ (wherein M means an alkali metal or an alkaline earth metal, and n indicates the valence thereof, 1 or 2), generally at least 0.02, preferably at least 0.04, more preferably at least 0.05, and is generally at most 0.5, preferably at most 0.4, more preferably at most 0.3.

In forming a zeolite membrane of a CHA-type aluminosilicate, it is desirable that the alkali metal to be used contains potassium (K), since a denser and higher crystalline membrane may be formed. The molar ratio of K to the total of alkali metals and alkaline earth metals is generally at least 0.01, preferably at least 0.2, more preferably at least 0.3, and the upper limit thereof is generally at most 1.

Addition of K to the aqueous reaction mixture constructed with the preferred range in the invention tends to enlarge in a moderate degree, the ratio of the peak intensity of the peak at around $2\theta=9.6°$ assigned to the plane with an index of (1,0,0) in the CHIA structure, to the peak intensity of the peak at around $2\theta=20.8°$ assigned to the plane (2,0,−1), assuming that the space group using rhombohedral setting is:

$$R\bar{3}m \qquad \text{[Math. 4]}$$

(No. 166), as described above.

The ratio of the Si element source and water is, as the ratio by mol of water to $SiO_2$ (molar ratio of $H_2O/SiO_2$), generally at least 10, preferably at least 30, more preferably at least 40, even more preferably at least 50, and is generally at most 1000, preferably at most 500, more preferably at most 200, even more preferably at most 150.

When the molar ratios of the substances in the aqueous reaction mixture each fall within the above range, a dense zeolite membrane can be formed. The amount of water is especially important in formation of the dense zeolite membrane, and under the condition where the amount of water is larger than that of silica as compared with the ordinary condition in powdery synthesis, a dense membrane can be formed readily.

In general, the amount of water in synthesis of a powdery CHA-type aluminosilicate zeolite is, as the molar ratio of $H_2O/SiO_2$, from 15 to 50 or so. When the molar ratio of $H_2O/SiO_2$ is increased (to be 50 or more and 1000 or less), or that is, under the condition where the amount of water is large, a zeolite membrane composite having a CHA-type aluminosilicate zeolite crystallized on the surface of a support or the like as a dense membrane thereon and therefore having high separation performance can be obtained.

Further, in hydrothermal synthesis, it is not always necessary to make a seed crystal present inside the reaction system, but by adding a seed crystal to the system, zeolite crystallization on a support can be promoted. The method of adding a seed crystal is not specifically defined. Like in powdery zeolite synthesis, employable here is a method of adding a seed crystal to the aqueous reaction mixture, or a method of attaching a seed crystal onto a support. In producing the zeolite membrane composite, it is desirable that a seed crystal is attached onto a support. Previously attaching a seed crystal onto a support facilitates formation of a dense zeolite membrane having good separation performance.

Not specifically defined in point of the type thereof, the seed crystal to be used here may be any zeolite capable of promoting crystallization. Preferably, however, the same crystal type as that of the zeolite membrane to be formed is used for efficient crystallization. In case where a CHA-type aluminosilicate zeolite membrane is formed, preferred is use of a seed crystal of CHA-type zeolite.

The grain size of the seed crystal is preferably smaller, and, if desired, the seed crystal may be ground before use herein. The grain size is generally at least 0.5 nm, preferably at least 1 nm, more preferably at least 2 nm, and is generally at most 5 µm, preferably at most 3 µm, more preferably at most 2 m.

The method of attaching a seed crystal onto a support is not specifically defined. For example, employable here are a dipping method that comprises dispersing a seed crystal in a solvent such as water or the like and then dipping a support in the dispersion to make the seed crystal adhere to the support, and a coating method that comprises mixing a seed crystal with a solvent such as water or the like to give a slurry and then applying the resulting slurry with rubbing onto a support. Preferred is the dipping method for reproducible production of a membrane composite under control of the seed crystal adhering amount.

The solvent in which the seed crystal is dispersed is not specifically defined, but water and an alkaline aqueous solution are especially preferred. The type of the alkaline aqueous solution is not specifically defined. Preferred are an aqueous sodium hydroxide solution and an aqueous potassium hydroxide solution. These alkali species may be mixed. The alkali concentration is not also specifically defined, and may be generally at least 0.0001 mol %, preferably at least 0.002 mol %, more preferably at least 0.001 mol %, even more preferably at least 0.002 mol %. Also generally, the concentration is at most 1 mol %, preferably at most 0.8 mol %, more preferably at most 0.5 mol %, even more preferably at most 0.2 mol %.

The amount of the seed crystal to be dispersed is not specifically defined. In general, the amount is at least 0.01% by mass relative to the total mass of the dispersion, preferably at least 0.1% by mass, more preferably at most 0.5% by mass, and is generally at most 20% by mass, preferably at most 10% by mass, more preferably at most 5% by mass, even more preferably at most 3% by mass.

When the amount of the seed crystal to be dispersed is too small, then the amount of the seed crystal that adheres to the support would be small, and therefore the support would have any partial site where zeolite does not form during hydrothermal synthesis, and there is a probability that a defective membrane may form. When the amount of the seed crystal in the dispersion is too large, then the seed crystal would go to waste since the amount of the seed crystal to adhere to the support in the dipping method is nearly constant and it is therefore disadvantageous in point of the production cost.

It is desirable to attach a seed crystal onto a support according to the dipping method or through slurry application with rubbing and then to dry it to form a zeolite membrane.

The amount of the seed crystal to be previously attached to the support is not specifically defined. In terms of mass per $m^2$ of support, the amount is generally at least 0.01 g, preferably at least 0.05 g, more preferably at least 0.1 g, and is generally at most 100 g, preferably at most 50 g, more preferably at most 10 g, even more preferably at most 8 g.

When the amount of the seed crystal is less than the lower limit, then the crystal would be difficult to form, the membrane growth could be insufficient, and the membrane growth would be ununiform. On the other hand, when the amount of the seed crystal is more than the upper limit, then the surface roughness would be augmented by the seed crystal, spontaneous nuclei resulting from the seed crystal having dropped from the support would readily grow further and therefore the membrane growth on the support would be thereby interfered with. In any case falling outside the range, a dense zeolite membrane would be difficult to form.

In case where a zeolite membrane is formed on a support through hydrothermal synthesis, the method of fixing the support is not specifically defined. Herein employable is any configuration of vertical setting or horizontal setting. In this case, the zeolite membrane may be formed according to a stationary method, or may be formed while the aqueous reaction mixture is stirred.

Not specifically defined, the temperature in zeolite membrane formation is generally 100° C. or higher, preferably 120° C. or higher, more preferably 150° C. or higher, and is generally 200° C. or lower, preferably 190° C. or lower, more preferably 180° C. or lower. When the reaction temperature is too low, then zeolite crystallization would be difficult. On the other hand, when the reaction temperature is too high, then zeolite of a type different from the type of zeolite in the invention would often form.

The heating (reaction) time is not specifically defined, but is generally at least 1 hour, preferably at least 5 hours, more preferably at least 10 hours, and is generally at most 10 days, preferably at most 5 days, more preferably at most 3 days, and even more preferably at most 2 days. When the reaction time is too short, then zeolite crystallization would be difficult. When the reaction time is too long, then zeolite of a type different from the type of zeolite in the invention would often form.

The pressure in zeolite membrane formation is not specifically defined. The autogenous pressure to arise in heating the aqueous reaction mixture put in a closed container, within the temperature range would be enough. If desired, an inert gas such as nitrogen or the like may be added to the container.

The zeolite membrane composite formed through hydrothermal synthesis is washed with water, then heat-treated and dried. Here, the heat treatment means that the zeolite membrane composite is dried by heating it, or the template, if used, is fired.

For drying, the temperature in heat treatment is generally 50° C. or higher, preferably 80° C. or higher, more preferably 100° C. or higher, and is generally 200° C. or lower, preferably 150° C. or lower. For firing the template, the temperature is generally 350° C. or higher, preferably 400° C. or higher, more preferably 430° C. or higher, even more preferably 480° C. or higher, and is generally 900° C. or lower, preferably 850° C. or lower, more preferably 800° C. or lower, even more preferably 750° C. or lower.

The heating time is not specifically defined so far as the zeolite membrane could be fully dried or the template could be fired within the time, but is preferably at least 0.5 hours, more preferably at least 1 time. The upper limit is not specifically defined but is generally at most 200 hours, preferably at most 150 hours, more preferably at most 100 hours, even more preferably at most 24 hours.

In case where the hydrothermal synthesis is carried out in the presence of an organic template, it is suitable that, after the obtained zeolite membrane composite is washed with water, the organic template is removed, for example, through heat treatment, extraction or the like, preferably through heat treatment, or that is, firing.

When the firing temperature is too low, then the proportion of the remaining organic template may increase and, if so, the micropores in zeolite would decrease and, as a result, the gas permeation amount in separation and concentration would decrease. When the firing temperature is too high, then there is a possibility that the zeolite membrane would be cracked owing to the increased difference in the thermal expansion coefficient between the support and zeolite, and as a result, the zeolite membrane would lose denseness and the separation performance thereof would be low.

The firing time may vary depending on the heating speed and the cooling speed, and is not specifically defined so far as the organic template could be fully removed within the time. Preferably, the time is at least 1 hour, more preferably at least 5 hours. The upper limit is not specifically defined, and is, for example generally at most 200 hours, preferably at most 150 hours, more preferably at most 100 hours, even more preferably at most 24 hours. The firing may be carried out in an air atmosphere, to which, however, oxygen or an inert gas may be added.

The heating speed in firing is preferably as slow as possible in order that the difference in the coefficient of thermal expansion between the support and zeolite could provide few cracks in the zeolite membrane. The heating speed is generally at most 5° C./min, preferably at most 2° C./min, more preferably at most 1° C./min, even more preferably at most 0.5° C./min. In general, the heating speed is at least 0.1° C./min in consideration of operability.

After the firing, the cooling speed must also be controlled so as to prevent the zeolite membrane from being cracked. Like the heating speed, the cooling speed is also preferably lower. The cooling speed is generally at most 5° C./min, preferably at most 2° C./min, more preferably at most 1° C./min, even more preferably at most 0.5° C./min. In general, the cooling speed is at least 0.1° C./min in consideration of operability.

If desired, the zeolite membrane may be ion-exchanged, or may be silylated. The ion exchange is generally carried out after template removal in case where a template is used in synthesis. The ion to be exchanged includes proton, alkali metal ions such as $Na^+$, $K^+$, Li, etc.; Group 2 element ions such as $Ca^{2+}$, $Mg^{2+}$, $Sr^{2+}$, $Ba^{2+}$, etc.; ions of transition metals such as Fe, Cu, Zn, Ag, Al, Ga, La, etc. Of those, preferred are proton, $Na^+$, $Mg^{2+}$, and Fe, Al, Ga and La ions.

The ion exchange may be carried out according to a method where the zeolite membrane is, after fired (when a template is used), treated with an aqueous solution containing an ammonium salt or an exchanging ion such as $NH_4NO_3$, $NaNO_3$ or the like, or as the case may be, with an acid such as hydrochloric acid or the like, generally at a temperature of from room temperature to 100° C., and then washed with water. Further, if desired, the membrane may be fired at 200° C. to 500° C.

For silylation, for example, the zeolite membrane composite is dipped in a solution containing an Si compound. Accordingly, the zeolite membrane surface is modified with the Si compound to thereby get the above-mentioned specific physicochemical properties. For example, surely forming a layer that contains many Si-OH's on the surface of the zeolite membrane could enhance the polarity of the membrane surface and therefore could improve the separation performance of the polar molecules in the membrane. In addition, modifying the zeolite membrane surface with the Si compound can secondarily provide an effect of blocking the fine defects existing in the membrane surface.

The solvent to be used for the silylation treatment may be water or an organic solvent. The solution may be acidic or basic, and in the case, the silylation reaction could be catalyzed by acid or base. Not specifically defined, the silylating agent is preferably an alkoxysilane. The treatment temperature may be generally from room temperature to 150° C. or lower, and the treatment may be carried out for from 10 minutes to 30 hours or so, but may be determined depending on the type of the silylating agent and the solvent.

The air permeation through the heat-treated zeolite membrane composite is generally at least 10 $L/(m^2 \cdot h)$, preferably at least 20 $L/(m^2 \cdot h)$, more preferably at least 30 $L/(m^2 \cdot h)$, even more preferably at least 35 $L/(m^2 \cdot h)$, still more preferably at least 100 $L/(m^2 \cdot h)$. The upper limit of the permeation is not specifically defined but is preferably at most 1000 $L/(m^2 \cdot h)$, more preferably at most 800 $L/(m^2 \cdot h)$, even more preferably at most 700 $L/(m^2 \cdot h)$.

Here, the air permeation is the permeation of air [$L/(m^2 \cdot h)$] through the zeolite membrane composite which is put under atmospheric pressure and is connected to a vacuum line under 5 kPa inside it, as described in detail in the section of Examples.

The air permeation is a value that leads to gas permeation. Membranes having a large air permeation may have a large gas permeation, but those having a too large air permeation may be often poor in separability. The zeolite membrane of the invention has a suitable air permeation as described above, and has a large gas permeation and good separation performance, and in particular, the zeolite membrane has a performance suitable for separation of vapor components.

The zeolite membrane composite thus produced as above has excellent properties and can be favorably used as a membrane separating means for a vapor mixture or a liquid mixture in the invention.

<Separation or Concentration Method for Vapor Mixture>

The separation or concentration method for a vapor mixture of the invention comprises bringing a vapor mixture of multiple vapor components into contact with the above-mentioned zeolite membrane composite to thereby separate the highly-permeative component through permeation from the vapor mixture, or to thereby separate the highly-permeative vapor component through permeation therefrom so as to concentrate the poorly-permeative vapor component in the mixture. One separation function of the zeolite membrane of the invention is separation as a molecular sieve through which vapor molecules having a size or not more than the effective pore size of the zeolite used can be separated from the other vapor molecules smaller than the former.

Accordingly, the highly-permeative vapor component as referred to in the invention is a vapor component capable of readily passing through the micropores of the zeolite crystal phase of a CHA-type aluminosilicate, and is preferably a vapor component comprising vapor molecules of which the molecular size is smaller than about 0.38 nm or so.

The effective pore size of zeolite may be controlled by the metal species to be introduced, and also by ion exchange, acid treatment, silylation treatment or the like. By controlling the effective pore size, the separation performance of the membrane can be improved.

The pore size would be slightly influenced by the atomic diameter of the metal species to be introduced into the zeolite framework. When a metal of which the atomic diameter is larger than that of silicon, concretely for example, boron (B) or the like is introduced, the pore size could be small; while when a metal having a larger atomic diameter than that of silicon, concretely for example, tin (Sn) or the like is introduced, then the pore size could be large. By removing the introduced metal from the framework through acid treatment, the pore size would also be influenced, as the case may be.

In case of ion exchange with a monovalent ion having a large ionic diameter, the effective pore size tends to reduce, while on the other hand, in case of ion exchange with a monovalent ion having a small ionic diameter, the effective pore size could be a value close to the pore size which the CHA structure has. In case of ion exchange with a divalent ion such as calcium, the effective pore size could also be a value close to the pore size which the CHA structure has, depending on the position of the exchange site.

Silylation treatment could reduce the effective pore size of zeolite. Silylation of the terminal silanol in the outer surface further combined with lamination with a silylating layer could reduce the effective pore size of the micropores facing the outer surface of zeolite.

Still another separation function of the zeolite membrane composite of the invention is to control the adsorption of vapor molecules to the zeolite membrane through control of the surface properties of zeolite. Specifically, by controlling the polarity of zeolite, highly-adsorbable molecules could be made to readily pass through the membrane composite.

It is possible to enlarge the polarity of zeolite by substituting Si in the zeolite framework with Al, and accordingly, vapor molecules having a high polarity could be made to positively adsorb to or pass through zeolite micropores. When the amount of Al substitution decreases, then the zeolite membrane could have a small polarity and would be therefore advantageous for making poorly-polar vapor molecules pass through the membrane. It is also possible to introduce any of Ga, Fe, B, Ti, Zr, Sn and Zn into any other element source than the Al element source for polarity control.

In addition, the absorbability of molecules and the pore size of zeolite may be controlled by ion exchange, whereby the permeation performance may also be controlled.

In the invention, the desired vapor mixture includes those containing at least one component selected from carbon dioxide, hydrogen, oxygen, nitrogen, methane, ethane, ethylene, propane, propylene, normal butane, isobutane, 1-butene, 2-butene, isobutene, sulfur hexafluoride, helium, carbon monoxide, nitrogen monoxide, water, etc. Of the components of the vapor mixture containing the above-mentioned gas, the vapor components having a high permeance are separated through the zeolite membrane composite, while the vapor components having a low permeance are concentrated on the side of the supply gas.

More preferably, the vapor mixture contains at least two components of the above-mentioned components. In this case, the two components are preferably a combination of a component having a high permeance and a component having a low permeance.

The condition for gas separation varies depending on the gas species and the composition to be targeted and on the membrane performance. In general, the temperature is from $-20$ to $300°$ C., preferably from 0 to $200°$ C., more preferably from 0 to $150°$ C. The separation at 0 to $25°$ C. is often at a temperature close to the ambient temperature, and is therefore advantageous in that it does not require any energy for temperature control for the gas to be separated or may require only a small amount of energy. A gas highly adsorbable to the zeolite membrane tends to have an increased permeability even at a low temperature, and for the purpose of increasing the permeation thereof, the gas of the type may be cooled in a range of $25°$ C. or lower and $-20°$ C. or higher.

The pressure of the supply gas may be as such in case where the gas to be separated is under high pressure, but the pressure may be suitably reduced and adjusted to a desired pressure for use herein. In case where the pressure of the gas to be separated is lower than that for use in separation, the pressure may be increased by the use of a compressor or the like.

Not specifically defined, the pressure of the supply gas may be generally atmospheric pressure, or may be higher than atmospheric pressure, and is preferably at least 0.1 MPa, more preferably at least 0.11 MPa. The upper limit is generally at most 20 MPa, preferably at most 10 MPa, more preferably at most 1 MPa.

Not also specifically defined, the differential pressure between the gas on the supply side and the gas on the permeation side is generally at most 20 MPa, preferably at most 10 MPa, more preferably at most 5 MPa, even more preferably at most 1 MPa. Also in general, the differential pressure is at least 0.001 MPa, preferably at least 0.01 MPa, more preferably at least 0.02 MPa.

Here, the differential pressure means the difference between the partial pressure of the gas on the supply side and the partial pressure thereof on the permeation side. Unless otherwise specifically indicated, pressure [Pa] indicates absolute pressure.

Not specifically defined, the pressure on the permeation side is generally at most 10 MPa, preferably at most 5 MPa, more preferably at most 1 MPa, even more preferably at most 0.5 MPa. The lower limit is not also limited, and the pressure may be 0 MPa or more. Under the condition where the pressure is 0 MPa, the separation through the membrane realizes a state where the concentration of a highly-permeative vapor could be the lowest in the poorly-permeative gas. For the case where the gas on the permeation side is used while kept having a high pressure, the pressure on the permeation side may be set high.

The flow rate of the supply gas may be such that the supply gas flow can supplement the decrease in the permeating gas and such that the flow rate can secure gas mixing enough to make the concentration of the poorly-permeative gas in the supply gas at around the membrane the same as the concentration of the entire gas. Therefore, depending on the tubular diameter of the separation unit and the separation performance of the membrane, the flow rate is generally at least 0.5 mm/sec, preferably at least 1 mm/sec. The upper limit is not specifically defined, and is generally at most 1 m/sec, preferably at most 0.5 m/sec.

In the separation or concentration method for a vapor mixture of the invention, a sweep gas may be used. In the method of using a sweep gas, a gas differing from the supply gas is made to flow on the permeation side and the gas having permeated through the membrane is collected by the action of the sweep gas.

The pressure of the sweep gas is generally atmospheric pressure and is not specifically defined. Preferably, the pressure is at most 20 MPa, more preferably at most 10 MPa, even more preferably at most 1 MPa, and the lower limit thereof is preferably at least 0.09 MPa, more preferably at least 0.1 MPa. As the case may be, the sweep gas may be under reduced pressure.

Not specifically defined, the flow rate of the sweep gas may be such that the permeated gas could be fully substituted with the sweep gas. In general, the flow rate is at least 0.5 mm/sec, preferably at least 1 mm/sec. The upper limit is not specifically defined, and may be generally at most 1 m/sec, preferably at most 0.5 m/sec.

The apparatus for use in gas separation is not specifically defined. In general, the membrane is used as incorporated in a module. The membrane module may be, for example, an apparatus schematically shown in FIG. 1 or FIG. 2. Also employable here are membrane modules exemplified in, for example, "Gas Separation/Purification Techniques", published by Toray Research Center, 2007, page 22, etc.

For use in membrane separation of gas, the membranes may be configured as multiple stages. Specifically, a gas to be separated is applied to a membrane module, and the gas on the non-permeation that has not passed through the membrane is further applied to another membrane module, or the permeated gas may be applied to another membrane module. In the former method, the concentration of the poorly-permeative gas on the non-permeation side may be further increased, and in the latter method, the concentration of the highly-permeative gas in the permeated gas may be further increased.

When the gas is applied to the latter-stage membrane in separation through multistage membranes, if desired, the gas pressure may be adjusted by the use of a booster or the like.

In the multistage membranes, membranes each having different performance may be arranged in individual stages. Regarding the membrane performance, in general, a membrane having high permeation performance may have low separation performance while, on the other hand, a membrane having high separation performance may have low permeation performance. Consequently, in processing a mixture through a membrane having high permeability until the vapor component to be separated or concentrated therein could reach a predetermined concentration, the necessary membrane area could be small while the poorly-permeative component that is desired to be concentrated on the non-permeation side would pass through the membrane to move to the permeation side, but on the other hand, in processing the mixture through a membrane having high separation performance, the poorly-permeative component that is desired to be concentrated on the non-permeation side could hardly pass through the membrane to move to the permeation side, but the necessary membrane area may increase. In separation through one membrane, the relationship between the necessary membrane area and the permeation amount of the gas to be concentrated could hardly be controlled, but using multiple membranes each having different performance could facilitate the control. Depending on the membrane cost and the cost of the gas to be separated/collected, the membrane to be used is so controlled as to realize the best relation of the suitable membrane area and the permeation amount of the gas to be concentrated, thereby maximizing the advantages as a whole.

The zeolite membrane composite of the invention is excellent in chemical resistance, oxidation resistance, heat-resistant stability and pressure resistance, exhibits high permeation performance and separation performance, and has performance excellent in durability. In particular, the zeolite membrane composite shows excellent separation performance for separating inorganic gas and lower hydrocarbon.

High permeation performance as referred to herein indicates a sufficient throughput and, for example, means that the permeance of a membrane for the vapor component that passes therethrough $[\text{mol} \cdot (\text{m}^2 \cdot \text{s} \cdot \text{Pa})^{-1}]$ is, for example, when carbon dioxide is made to pass through the membrane at a temperature of 50° C. and under a differential pressure of 0.098 MPa, generally at least $3 \times 10^{-8}$, preferably at least $3 \times 10^{-7}$, more preferably at least $5 \times 10^{-7}$, even more preferably at least $7 \times 10^{-7}$, still more preferably at least $1 \times 10^{-6}$. The upper limit is not specifically defined and is generally at most $3 \times 10^{-4}$.

Also, the permeance $[\text{mol} \cdot (\text{m}^2 \cdot \text{s} \cdot \text{Pa})^{-1}]$ is, for example, when methane is made to pass through the membrane under the same condition, generally at most $3 \times 10^{-7}$, preferably at most $3 \times 10^{-8}$, more preferably at most $3 \times 10^{-9}$, and ideally, the permeance is 0, but may be on an order of from $10^{-10}$ to $10^{-14}$ or so for practical use.

Here, permeance (also referred to as permeability) is a value to be obtained by dividing the permeated substance amount by the product of the membrane area, the time and the partial pressure difference between the supply side to which the substance to be permeated is supplied and the permeation side, and the unit thereof is $[\text{mol} \cdot (\text{m}^2 \cdot \text{s} \cdot \text{Pa})^{-1}]$. The value is calculated according to the method described in the section of Examples.

The selectivity of the zeolite membrane is expressed by an ideal separation coefficient and separation coefficient. The ideal separation coefficient and the separation coefficient each are an index that indicates selectivity generally used in membrane separation. The ideal separation coefficient is a value to be calculated according to the method described in the section of Examples, and the separation coefficient is a value to be calculated according to the method mentioned below.

In separation of a mixed gas, the separation coefficient is calculated according to the following formula (2).

$$\text{Separation Coefficient} = (Q'_1/Q'_2)/(P'_1/P'_2) \qquad (2)$$

[In the formula (2), $Q'_1$ and $Q'_2$ each indicate the permeation amount [mol·(m²·s)⁻¹] of the highly-permeative gas and the poorly-permeative gas, respectively; and $P'_1$ and $P'_2$ each indicate the partial pressure [Pa] of the highly-permeative gas and the poorly-permeative gas in the supply gas.]

The separation coefficient may also be calculated according to the following formula (3).

$$\text{Separation Coefficient} = (C'_1/C'_2)/(C_1/C_2) \quad (3)$$

[In the formula (3), $C'_1$ and $C'_2$ each indicate the concentration [mol %] of the highly-permeative gas and the poorly-permeative gas in the permeated gas, respectively; and $C_1$ and $C_2$ each indicate the concentration [mol %] of the highly-permeative gas and the poorly-permeative gas in the supply gas.]

The ideal separation coefficient is, for example, when carbon dioxide and methane are made to pass through the membrane at a temperature of 50° C. and under a differential pressure of 0.1 MPa, generally at least 10, preferably at least 20, more preferably at least 30, even more preferably at least 40, still more preferably at least 50. The upper limit of the ideal separation coefficient is for the case where only carbon dioxide passes through the membrane, and in the case, the ideal separation coefficient reaches an infinite value. In practice, the separation coefficient could be at most 100,000 or so.

The separation coefficient is, for example, when a 1/1 mixed gas of carbon dioxide and methane is applied for permeation at a temperature of 50° C. and under a differential pressure of 0.098 MPa, generally at least 10, preferably at least 20, more preferably at least 30, even more preferably at least 40, still more preferably at least 50. The upper limit of the separation coefficient is for the case where only carbon dioxide passes through the membrane, and in the case, the separation coefficient reaches an infinite value. In practice, the separation coefficient could be at most 100,000 or so.

The zeolite membrane composite of the invention is, as described above, excellent in chemical resistance, oxidation resistance, heat-resistant stability and durability, exhibits high permeation performance and separation performance, and is excellent in durability. For example, the zeolite membrane composite is especially favorably used for gas separation technology to be mentioned below.

Carbon dioxide separation technology includes removal of carbon dioxide from natural gas, removal of carbon dioxide from landfill gas to be generated in landfilling with organic substances such as household wastes and the like (containing methane about 60%, carbon dioxide about 40%, and minor nitrogen and water vapor), etc.

Hydrogen separation technology includes hydrogen recovery in petroleum purification industry, hydrogen recovery/purification in various reaction processes in chemical industry (mixture of hydrogen, carbon monoxide, carbon dioxide, hydrocarbon, etc.), production of high-purity hydrogen for fuel cells, etc. Production of hydrogen for fuel cells is through water vapor modification reaction of methane, and separation of hydrogen from a mixed gas of $H_2$, CO, $CH_4$ and $H_2O$ is needed.

In addition, there are further mentioned production of oxygen-rich gas from air (for medical use, oxygen-rich air for combustion, etc.) as oxygen separation technology, production of nitrogen-rich gas from air (for antiexplosion, antioxidation, etc.) as nitrogen separation technology, water vapor separation (demoisturization for precision instruments, etc.), dissolved gas separation (deaeration from water, organic liquids), organic gas separation (organic gas separation, separation of olefins, paraffins in petroleum refining industry, petrochemical industry), etc.

<Separation or Concentration Method for Liquid Mixture>

The separation or concentration method for a liquid mixture of the invention comprises bringing a liquid mixture of multiple components into contact with the above-mentioned zeolite membrane composite to thereby separate the highly-permeative component through permeation from the liquid mixture, or to thereby separate the highly-permeative component through permeation therefrom so as to concentrate the poorly-permeative component in the mixture. In the invention, the zeolite membrane composite to be used may be the same as that mentioned above, and preferred embodiments thereof are also the same as above.

In the invention, via an inorganic porous support equipped with the zeolite membrane, a liquid mixture containing an organic compound is kept in contact with one side of the support side or the zeolite membrane side, whereupon the opposite side is kept under a lower pressure than that on the side with which the mixture is kept in contact, and accordingly, the component that is highly permeative through the zeolite membrane (the substance in the mixture of which the permeability is relatively high) is selectively made to pass through the membrane, or that is, the highly-permeative component is made to pass therethrough as a main component. Consequently, the highly-permeative component (substance) can be separated from the liquid mixture. As a result, the concentration of the specific organic compound in the mixture (the substance in the mixture of which the permeability is relatively low) can be increased, and the specific organic compound can be thereby separated and collected, or concentrated.

Not specifically defined, the liquid mixture for separation or concentration may be any and every type of liquid mixture that comprises multiple components capable of being separated or concentrated through the zeolite membrane composite of the invention.

In case where the liquid mixture is, for example, a mixture of an organic compound and water (hereinafter this may be referred to as "water-containing organic compound"), in general, water is highly permeative through the zeolite membrane, and therefore water is separated from the mixture and the organic compound is concentrated in the original mixture. A separation or concentration method that is referred to as a pervaporation method or a vapor permeation method is one embodiment of the method of the invention. The pervaporation method is a separation or concentration method that comprises introducing a liquid mixture into the separation membrane directly as it is, and therefore facilitates the process including separation or concentration.

The vapor permeation method is a separation/concentration method in which a liquid mixture is vaporized and then introduced into the separation membrane, and which therefore enables combined use with a distillation apparatus or is applicable to separation at a higher temperature and a higher pressure. In addition, in the vapor permeation method, a liquid mixture is, after vaporized, introduced into the separation membrane, and therefore in this, the influence of the impurities contained in the supply liquid as well as that of the substance therein to form an associate or an oligomer in a liquid state on the membrane can be reduced. The zeolite membrane composite of the invention can be favorably used in any method.

In case of high-temperature separation according to the vapor permeation method, in general, the separation performance lowers more when the temperature is higher; however, the zeolite membrane composite of the invention can express high separation performance even at a high temperature. With that, in general, in the vapor permeation method, the liquid mixture is first vaporized and then separated, and therefore, in general, the separation condition is severer than in the pervaporation method, and accordingly, the vapor permeation method requires durability of the membrane composite to be used therein. The zeolite membrane composite of the invention has durability enough for separation even under high-temperature condition, and is therefore favorable for the vapor permeation method.

The zeolite membrane composite of the invention can still exhibit high permeation performance and selectivity even when used for processing a water-containing organic compound having a water content of 20% by mass or more therethrough, and therefore secures performance as a separation membrane excellent in durability.

Here, the high permeation performance indicates a sufficient amount of throughput, and for example, means that the permeation flux of the substance to pass through the membrane is, when, for example, a mixture of 2-propanol or N-methyl-2-pyrrolidone and water having a water content of 30% by mass is made to penetrate through the membrane at 70° C. and under a pressure difference of 1 atmosphere ($1.01 \times 10^5$ Pa), at least 1 kg/(m²·hr), preferably at least 3 kg/(m²·hr), more preferably at least 5 kg/(m²·hr). The upper limit of the permeation flux is not specifically defined, and may be generally at most 20 kg/(m²·hr), preferably at most 15 kg/(m²·hr).

High permeation performance may be expressed in terms of permeance (also referred to as permeability). Permeance indicates a permeation flux per pressure difference (pressure normalized flux), and is a value to be obtained by dividing the permeated substance amount by the product of the membrane area, the time and the water partial pressure difference. In the case of expression in terms of permeance, for example, when a mixture of 2-propanol or N-methyl-2-pyrrolidone and water having a water content of 30% by mass is permeated under a pressure difference of 1 atmospheric pressure ($1.01 \times 10^5$ Pa) at 70° C., the water permeance is generally at least $3 \times 10^{-7}$ mol/(m²·s·Pa), preferably at least $5 \times 10^{-7}$ mol/(m²·s·Pa), more preferably at least $1 \times 10^{-6}$ mol/(m²·s·Pa), even more preferably at least $2 \times 10^{-6}$ mol/(m²·s·Pa). The upper limit of the permeance is not specifically defined, and is generally at most $1 \times 10^{-4}$ mol/(m²·s·Pa), preferably at most $5 \times 10^{-5}$ mol/(m²·s·Pa).

The selectivity is represented by a separation coefficient. The separation coefficient is calculated according to the following formula (4) to indicate the selectivity generally used in membrane separation.

$$\text{Separation Coefficient} = (P_\alpha/P_\beta)/(F_\alpha/F_\beta) \quad (4)$$

[wherein $P_\alpha$ indicates the mass percent concentration of the main component in the permeated liquid; $P_\beta$ indicates the mass percent concentration of the accessory component in the permeated liquid; $F_\alpha$ indicates the mass percent concentration of the component to be the main component in the permeated liquid, in the mixture to be separated; and $F_\beta$ indicates the mass percent concentration of the component to be the accessory component in the permeated liquid, in the mixture to be separated.]

The separation coefficient is, for example, when a mixture of 2-propanol or N-methyl-2-pyrrolidone and water having a water content of 30% by mass is permeated under a pressure difference of 1 atmospheric pressure ($1.01 \times 10^5$ Pa) at 70° C., generally at least 1000, preferably at least 4000, more preferably at least 10000, even more preferably at least 20000. The upper limit of the separation coefficient is in the case where entirely water only could pass through the membrane, and in the case, the separation coefficient would reach an infinite value, but the separation coefficient is preferably at most 10000000, more preferably at most 1000000.

In case where the subject to be separated is a water-containing organic compound, the water content thereof is generally at least 20% by mass, preferably at least 30% by mass, more preferably at least 45% by mass, and is generally at most 95% by mass, preferably at most 80% by mass, more preferably at most 70% by mass.

In the method of the invention, the substance to pass through the zeolite membrane is generally water. In the case, when the water content is low, then the method would be inefficient since the throughput may lower. On the other hand, when the water content is too large, then the membrane necessary for concentration would have a large area (in case where the membrane is formed to be tubular, the number of the tubes would increase), and therefore the economic outcomes would decrease.

The water content of the water-containing organic compound may be previously adjusted according to a suitable water content controlling method. In this case, the preferred water content is the same as above. The water content controlling method may be any per-se known method, including, for example, distillation, pressure swing adsorption (PSA), temperature swing adsorption (TSA), desiccant system, etc.

Further, water may be further separated from the water-containing organic compound from which water has been separated through the zeolite membrane composite. Accordingly, water may be separated more highly, and the water-containing organic compound may be concentrated more highly.

The organic compound includes, for example, carboxylic acids such as acetic acid, acrylic acid, propionic acid, formic acid, lactic acid, oxalic acid, benzoic acid, etc.; organic acids such as sulfonic acid, sulfinic acid, barbituric acid, uric acid, phenol, enol, diketone-type compounds, thiophenone, imide, oxime, aromatic sulfonamide, primary and secondary nitro compounds, etc.; alcohols such as methanol, ethanol, isopropanol (2-propanol), etc.; ketones such as acetone, methyl isobutyl ketone, etc.; aldehydes such as acetaldehyde, etc.; ethers such as dioxane, tetrahydrofuran, etc.; amides and other nitrogen-containing organic compounds (N-containing organic compounds) such as dimethylformamide, N-methylpyrrolidone, etc.; esters such as acetates, acrylates, etc.

Of those, in case where an organic acid is separated from a mixture of an organic acid and water based on the characteristics of both molecular sieve and hydrophilicity, the effect of the zeolite membrane composite is noticeably expressed. Preferred is a mixture of a carboxylic acid and water, and a more preferred example is separation of acetic acid from water.

In case where an organic substance and water are separated from a mixture of any other organic substance than an organic acid and water, the organic substance is preferably one having 2 or more carbon atoms, more preferably 3 or more carbon atoms.

Of those other organic substances than organic acids, especially preferred is an organic compound containing at least one selected from alcohols, ethers, ketones, aldehydes and amides. Of the organic compounds, preferred are those having from 2 to 10 carbon atoms, and more preferred are those having from 3 to 8 carbon atoms.

The organic compound may also be a polymer compound capable of forming a mixture with water (mixed solution). The polymer compound includes those having a polar group in the molecule, for example, polyols such as polyethylene glycol, polyvinyl alcohol, etc.; polyamines; polysulfonic acids; polycarboxylic acids such as polyacrylic acid, etc.; polycarboxylic acid esters such as polyacrylic acid esters, etc.; modified polymer compounds prepared by modifying polymers through graft polymerization or the like; copolymerized polymer compounds prepared by copolymerization of a nonpolar monomer such as olefin or the like and a polar monomer having a polar group such as a carboxyl group, etc.

The water-containing organic compound may be a mixture capable of forming an azeotropic mixture, such as a mixture of water and phenol, and in separation of a mixture that forms an azeotropic mixture, the invention is advantageous in that water can be separated selectively and more efficiently than in separation by distillation. Concretely, there are mentioned a mixture of an alcohol such as ethanol, 1-propanol, 2-propanol, 1-butanol, 2-butanol or the like, and water; a mixture of an ester such as ethyl acetate, ethyl acrylate, methyl methacrylate or the like, and water; a mixture of a carboxylic acid such as formic acid, isobutyric acid, valeric acid or the like, and water; a mixture of an aromatic organic substance such as phenol, aniline or the like, and water; a mixture of a nitrogen-containing compound such as acetonitrile, acrylonitrile or the like, and water, etc.

Further, the water-containing organic compound may also be a mixture of water and a polymer emulsion. Here, the polymer emulsion is a mixture of a surfactant and a polymer that is generally used in adhesives, coating materials, etc. The polymer for use in the polymer emulsion includes, for example, thermoplastic resins, such as polyvinyl acetate, polyvinyl alcohol, acrylic resin, polyolefin, olefin-polar monomer copolymer such as ethylene-vinyl alcohol copolymer or the like, polystyrene, polyvinyl ether, polyamide, polyester, cellulose derivative, etc.; thermosetting resins such as urea resin, phenol resin, epoxy resin, polyurethane, etc.; rubbers such as natural rubber, polyisoprene, polychloroprene, butadiene copolymer such as styrene-butadiene copolymer or the like, etc. As the surfactant, herein employable is any per-se known one.

The zeolite membrane composite of the invention has acid resistance, and therefore can be effectively utilized especially for separation of water from a mixture of water and an organic acid such as acetic acid or the like or for separation of water for promoting esterification.

The separation or concentration method for a liquid mixture of the invention may be carried out by producing a suitable separation or concentration apparatus, for example, the apparatus as schematically shown in FIG. 3, by the use of the above-mentioned zeolite membrane composite, and introducing a liquid mixture of multiple components into the apparatus. The separation or concentration apparatus can be produced by the use of per-se known members.

EXAMPLES

The invention is described more concretely, based on the following Examples; however, not overstepping the gist thereof, the invention is not limited by the following Examples. The production conditions and the data of the evaluation results in the following Examples have implications of preferred data in a range of the upper limit or the lower limit in the embodiments of the invention, and the preferred range may be one to be defined by the combination of the upper or lower limit and the data in the following Examples or by the combination of the data themselves in the following Examples.

In the following Examples and Comparative Examples, the physical properties and the separation performance of the zeolite membranes were measured according to the methods mentioned below.

(1) X-Ray Diffractometry (XRD)

For XRD, the conditions are as mentioned below.
Apparatus: Netherlands PANaltical's X'PertPro MPD
Optical System Specification:
  Incidence Side: Encapsulated X-ray tube (CuKα)
  Soller Slit (0.04 rad)
  Divergence Slit (Variable Slit)
  Stage: XYZ stage
Light-Receiving Side: Semiconductor array detector (X'Celerator)
  Ni-Filter
  Soller Slit (0.04 rad)
Goniometer Radius: 240 mm
Measurement Condition
  X-ray Output (CuKα): 45 kV, 40 mA
  Scanning Axis: θ/2θ
  Scanning Range (2θ): 5.0 to 70.00
  Measurement Mode: Continuous
  Reading Width: 0.050
  Counting Time: 99.7 sec
  Automatic Variable Slit (Automatic-DS):
    1 mm (irradiation width)
  Horizontal Diffusion Mask: 10 mm (irradiation width)

X-ray is applied in the direction vertical to the axial direction of the cylindrical tube. Application of X-ray is so controlled that that X-ray could hit mainly on the other line above the surface of the stage, but not on the surface of the stage in the two lines kept in contact with both the cylindrical tubular membrane composite put on the stage and the plane parallel to the surface of the stage, in order to prevent noise and others as much as possible.

During the measurement, the irradiation width is fixed to be 1 mm by the use of the automatic variable slit, and using Materials Data Inc.'s XRD analysis software, JADE 7.5.2 (Japanese version), the XRD pattern is obtained through variable slit→fixed slit conversion.

(2) SEM-EDX
  Apparatus: SEM: FE-SEM Hitachi: S-4800
  EDX: EDAX Genesis
  Accelerating Voltage: 10 kV
  At 5000-power, the entire viewing field (25 μm×18 μm) is scanned for X-ray quantitative analysis.

(3) SEM

For SEM measurement, the conditions are as mentioned below.
  Apparatus: SEM: FE-SEM Hitachi: S-4100
  Accelerating Voltage: 10 kV (4) Air Permeation Under atmospheric pressure, one end of the zeolite membrane composite is sealed up and the other end is connected to a vacuum line at 5 kPa in an airtight state, and the air flow rate is measured with the mass flow meter installed between the vacuum line and the zeolite membrane composite to give the air permeation [L/(m$^2$·h)]. As the mass flow meter, used here is KOFLOC's Model 8300, for N$_2$ gas with a maximum flow rate of 500 ml/min (as a value at 20° C. and 1 atmospheric pressure). When the indication on the mass flow meter in KOFLOC's Model 8300 is not more than 10 ml/min (as a value at 20° C. and 1 atmospheric pressure), Lintec's MM-2100M is used, which is for air with a maximum flow rate of 20 ml/min (as a value at 0° C. and 1 atmospheric pressure).

(5) Water Vapor Adsorption Isotherm

Using an adsorption isotherm measuring apparatus (BEL-SORP 18, by BEL Japan), the water vapor adsorption isotherm at 35° C. is measured. The zeolite membrane composite is previously cut into a suitable size that can be put in the measurement cell. While degassed in vacuum, the sample is heated and dried at 120° C. for 5 hours, and then used for the measurement. Regarding the measurement condition, the air thermostat bath temperature is 50° C., the adsorption temperature is 35° C., the initial introduction pressure is 3 Torr ($4.00 \times 10^2$ Pa), the saturation vapor pressure is 42.181 Torr ($56.237 \times 10^2$ Pa), and the equilibrium time is 500 seconds.

From the found data, the water adsorption (g) per gram of the CHA-type zeolite membrane composite at a relative pressure of 0.8 and 0.2 is obtained.

(6) Single-Component Gas Permeation Test

The single-component gas permeation test is as follows, using an apparatus schematically shown in FIG. 1. The sample gas to be used includes carbon dioxide (purity 99.9%, by Koatsu Gas Kogyo), methane (purity 99.999%, by Japan Fine Products), hydrogen (purity 99.99% or more, generated from HORIBA STEC's hydrogen generator OPGU-2200), nitrogen (purity 99.99%, by Toho Sanso Kogyo), helium (purity 99.99, by Japan Helium Center).

In FIG. 1, the cylindrical zeolite membrane composite 1 is installed in a thermostat bath (not shown) while housed in the stainless-made pressure-tight container 2. A temperature controller that enables temperature control of the sample gas is attached to the thermostat bath.

One end of the cylindrical zeolite membrane composite 1 is sealed up with the columnar end pin 3. The other end is connected to the connection 4, and the other end of the connection 4 is connected to the pressure-tight container 2. The inside of the cylindrical zeolite membrane composite 1 and the duct 11 for discharging the permeated gas 8 (permeated gas discharging duct) are connected via the connection 4, and the duct 11 extends outside the pressure-tight container 2. The pressure gauge 5 for measuring the pressure on the supply side of the sample gas is connected to any site to communicate with the pressure-tight container 2. Every connection secures airtight connection.

The single-component gas permeation test using the apparatus of FIG. 1 is as follows. A sample gas (supply gas 7) is supplied between the pressure-tight container 2 and the zeolite membrane composite 1 under a constant pressure, and the permeated gas 8 having passed through the zeolite membrane composite is measured with a flow rate meter (not shown) connected to the duct 11.

The single-component gas permeation test may also be carried out, using the apparatus schematically shown in FIG. 2 as follows.

In FIG. 2, the cylindrical zeolite membrane composite 1 is installed in a thermostat bath (not shown) while housed in the stainless-made pressure-tight container 2. A temperature controller that enables temperature control of the sample gas is attached to the thermostat bath.

One end of the cylindrical zeolite membrane composite 1 is sealed up with the columnar end pin 3. The other end is connected to the connection 4, and the other end of the connection 4 is connected to the pressure-tight container 2. The inside of the cylindrical zeolite membrane composite 1 and the duct 11 for discharging the permeated gas 8 are connected via the connection 4, and the duct 11 extends outside the pressure-tight container 2. The duct 12 for supplying a sweep gas 9 (sweep gas introducing duct) is inserted into the zeolite membrane composite 1 via the duct 11. Further, the pressure gauge 5 for measuring the pressure on the supply side of the sample gas and the back pressure valve 6 for controlling the pressure on the supply side are connected to any site to communicate with the pressure-tight container 2. Every connection secures airtight connection.

The single-component gas permeation test using the apparatus of FIG. 2 is as follows. A sample gas (supply gas 7) is supplied between the pressure-tight container 2 and the zeolite membrane composite 1 under a constant pressure, and the pressure on the supply side is made constant by the action of the back pressure valve 6. The flow rate of the discharged gas 10 discharged through the duct 11 is measured.

More concretely, for removing components such as vapor air and others, the system is dried at a temperature not lower than the measurement temperature, and degassed or purged with the supply gas to be used, then the sample temperature and the differential pressure between the side of the supply gas 7 and the side of the permeated gas 8 of the zeolite membrane composite 1 are kept constant, and after the permeated gas flow rate has become stabilized, the flow rate of the sample gas (permeated gas 8) having passed through the zeolite membrane composite 1 is measured, from which the gas permeance [$mol \cdot (m^2 \cdot s \cdot Pa)^{-1}$] is calculated. The pressure in calculating the permeance is the pressure difference (differential pressure) between the supply side and the permeation side of the supply gas.

Based on the above-mentioned measurement results, the ideal separation coefficient α is calculated according to the following formula (1):

$$\alpha = (Q_1/Q_2)/(P_1/P_2) \quad (1)$$

[In the formula (1), $Q_1$ and $Q_2$ each indicate the permeation amount [$mol \cdot (m^2 \cdot s)^{-1}$] of the highly-permeative gas and the poorly-permeative gas, respectively; and $P_1$ and $P_2$ each indicate the pressure difference [Pa] between the supply side and the permeation side of the highly-permeative gas and the poorly-permeative gas, respectively.]

This indicates the permeance ratio of each gas, and therefore can be obtained from the ratio thereof through calculation of the permeance of each gas.

(7) Vapor Permeation

FIG. 3 shows an outline view of the apparatus used for vapor permeation. In FIG. 3, the sample liquid 13 to be separated is fed to the vaporizer 15 via the feeding pump 14, at a predetermined flow rate, and is entirely vaporized by heating in the vaporizer 15 to be a gas to be separated. The gas to be separated is introduced into the zeolite membrane composite module 17 in the thermostat bath 16, and is supplied in the space outside of the zeolite membrane composite. The zeolite membrane composite module 17 is constructed by housing the zeolite membrane composite in a housing. The inside area of the zeolite membrane composite is depressurized by the vacuum pump 21 so that the pressure difference between the inside area thereof and the gas to be separated could be about 1 atmospheric pressure. The internal pressure can be measured with a Pirani gauge though not shown. Owing to the pressure difference, the permeative substance, water in the gas to be separated passes through the zeolite membrane composite. The permeated substance is trapped by the permeated liquid collecting trap 19, while the substance not trapped by the permeated liquid collecting trap 19, if any, is trapped by the cold trap 20. On the other hand, the component not permeated but left in the gas to be separated is liquefied and collected in the collecting trap 18 of liquid to be separated.

Example 1

An inorganic porous support-CHA-type zeolite membrane composite was produced through direct hydrothermal synthesis of a CHA-type aluminosilicate zeolite on an inorganic porous support, as described below.

As a reaction mixture for hydrothermal synthesis, the following was prepared.

0.306 g of aluminium hydroxide (containing 53.5% by mass of $Al_2O_3$, by Aldrich) was added to a mixture of 12.0 g of aqueous 1 mol/L-NaOH solution, 8.0 g of aqueous 1 mol/L-KOH solution and 115 g of water, and dissolved by stirring to give a transparent solution. As an organic template, 2.7 g of an aqueous solution of N,N,N-trimethyl-1-adamantanammonium hydroxide (hereinafter this is referred to as "TMADAOH") (containing 25% by mass of TMAD-AOH, by SACHEM) was added to the above, and further 12.0 g of colloidal silica (Nissan Chemical's Snowtec-40) was added thereto, and stirred for 2 hours to give a aqueous reaction mixture.

The composition (ratio by mol) of the reaction mixture is $SiO_2/Al_2O_3/NaOH/KOH/H_2O/TMADAOH=1/0.02/0.15/0.1/100/0.04$, and $SiO_2/Al_2O_3=50$.

As an inorganic porous support, a porous alumina tube (outer diameter 12 mm, inner diameter 9 mm) was cut into a length of 80 mm, washed with an ultrasonic washing machine, dried and then used here.

As a seed crystal, used here was a CHA-type zeolite that had been prepared to have a gel composition (ratio by mol) of $SiO_2/Al_2O_3/NaOH/KOH/H_2O/TMADAOH=1/0.066/0.15/0.1/100/0.04$, through hydrothermal synthesis for crystallization at 160° C. for 2 days in the presence of a porous alumina tube (outer diameter 12 mm, inner diameter 9 mm) followed by filtration of the resulting precipitate, washing with water and drying it. The grain size of the seed crystal was from 2 to 4 m or so. The seed crystal was dispersed in an aqueous alkali solution of 0.33 mass % NaOH and 0.31% KOH, at about 1% by mass, and the above-mentioned support was dipped in the resulting dispersion for a predetermined period of time, and thereafter dried at 100° C. for 4 hours or more to thereby make the seed crystal adhere to the support. After drying the mass increase was 8.1 g/m².

The support to which the seed crystal had adhered was dipped in the aqueous reaction mixture put in a Teflon®-made inner cylinder (200 ml), in the vertical direction therein, and the autoclave was sealed up, and while kept static therein, this was heated at 160° C. for 48 hours under autogenous pressure. After a predetermined period of time, this was left cooled and the zeolite membrane composite was taken out of the reaction mixture, then washed and dried at 100° C. for 4 hours or more.

The membrane composite was fired in air in an electric furnace at 500° C. for 5 hours. In this step, the heating speed and the cooling speed were both 0.5° C./min. The mass of the CHA-type zeolite crystallized on the support, which had been obtained from the difference between the mass of the membrane composite after fired and the mass of the support, was 148 g/m².

The membrane thickness, as obtained through SEM, was about 10 μm on average. After firing, one end of the cylindrical membrane composite was sealed up and the other end was connected to a vacuum line so that the inner pressure of the composite was reduced, and using the flow meter attached to the vacuum line, the air permeation amount was measured. The air permeation amount was 413 L/(m²·hr).

FIG. 4 shows the XRD pattern of the formed zeolite membrane. In the drawing, "*" indicates the support-derived peak. The data of XRD confirm the formation of CHA-type zeolite. (Peak intensity at around $2\theta=9.6°$)/(peak intensity at around $2\theta=20.8°$)=3.5, and (peak intensity at around $2\theta=17.9°$)/(peak intensity at around $2\theta=20.80$)=0.46.

FIG. 6 shows the XRD pattern of a powdery CHA-type zeolite (zeolite generally referred to as SSZ-13 in U.S. Pat. No. 4,544,538, this is hereinafter referred to as "SSZ-13"). (Peak intensity at around $2\theta=9.6°$)/(peak intensity at around $2\theta=20.8°$)=0.91, and (peak intensity at around $2\theta=17.9°$)/(peak intensity at around $2\theta=20.80$)=0.32.

As compared with the powdery CHA-type zeolite, the ratio of (peak intensity at around $2\theta=17.9°$)/(peak intensity at around $2\theta=20.8°$) of the zeolite membrane obtained in Example 1 was on the same level, but the ratio of (peak intensity at around $2\theta=9.6°$)/(peak intensity at around $2\theta=20.8°$) thereof was higher, from which the orientation to the plane (1,0,0) in rhombohedral setting is assumed.

The molar ratio of $SiO_2/Al_2O_3$ in the zeolite membrane was 37.2, as measured through SEM-EDX.

The water adsorption at a relative pressure of 0.8, as measured through water vapor adsorption isotherm analysis, was 2.2 times the water adsorption at a relative pressure of 0.2.

Using the CHA-type zeolite membrane composite produced in the above and using the apparatus shown in FIG. 1, the single-component gas permeation test was carried out. As a pretreatment, the zeolite membrane composite was processed as follows. $CO_2$ as the supply gas 7 was introduced between the pressure-tight container 2 and the zeolite membrane composite 1 at 140° C., and the pressure was kept at about 0.16 MPa. The inner pressure of the cylindrical zeolite membrane composite 1 was kept at 0.098 MPa (atmospheric pressure), and the membrane composite was dried for about 70 minutes. Carbon dioxide, methane, hydrogen, nitrogen and helium were thus tested as the sample gas.

Subsequently, the pressure on the supply side was made 0.2 MPa, and the supply gas was changed to the sample gas. In this step, the differential pressure between the side of the supply gas 7 and the side of the permeated gas 8 of the zeolite membrane composite 1 was 0.1 MPa.

Subsequently, the temperature was made 50° C., and after the temperature became stable, the supply gas was changed to the sample gas. In this step, the differential pressure between the side of the supply gas 7 and the side of the permeated gas 8 of the zeolite membrane composite 1 was 0.1 MPa.

Thus obtained, the permeance of each gas is shown in Table 1. The permeance of carbon dioxide at 50° C. is $1.6\times10^{-6}$ and is a high value. The permeance of hydrogen is $7.3\times10^{-7}$ and is also a high value. The data indicate that the gas permeance through the zeolite membrane composite obtained here is high. The ideal separation coefficient α of carbon dioxide and methane at 50° C. is 73.

TABLE 1

| | Permeance (mol/(m² · sec · Pa)) | |
|---|---|---|
| Gas | 50° C. | 140° C. |
| $H_2$ | $7.30 \times 10^{-7}$ | $6.37 \times 10^{-7}$ |
| $CH_4$ | $2.22 \times 10^{-8}$ | $6.21 \times 10^{-8}$ |

TABLE 1-continued

| Gas | Permeance (mol/(m² · sec · Pa)) | |
|---|---|---|
| | 50° C. | 140° C. |
| $N_2$ | $1.29 \times 10^{-7}$ | $9.79 \times 10^{-8}$ |
| He | $3.00 \times 10^{-7}$ | $3.41 \times 10^{-7}$ |
| $CO_2$ | $1.62 \times 10^{-6}$ | $5.80 \times 10^{-7}$ |

TABLE 2

| Gas | Permeance (mol/(m² · sec · Pa)) | |
|---|---|---|
| | 50° C. | 140° C. |
| $H_2$ | $1.01 \times 10^{-6}$ | $8.93 \times 10^{-7}$ |
| $CH_4$ | $3.91 \times 10^{-8}$ | $7.07 \times 10^{-8}$ |
| $N_2$ | $1.81 \times 10^{-7}$ | $1.34 \times 10^{-7}$ |
| He | $4.28 \times 10^{-7}$ | $4.79 \times 10^{-7}$ |
| $CO_2$ | $2.36 \times 10^{-6}$ | $8.20 \times 10^{-7}$ |

Example 2

An inorganic porous support-CHA-type zeolite membrane composite was produced in the same manner as in Example 1, except that the amount of aluminium hydroxide (containing 53.5% by mass of $Al_2O_3$, by Aldrich) to be added was changed to 0.152 and the composition (molar ratio) of the reaction mixture was changed to $SiO_2/Al_2O_3/NaOH/KOH/H_2O/TMADAOH=1/0.01/0.15/0.1/100/0.04$, and $SiO_2/Al_2O_3=100$. The mass increase after adhesion of the seed crystal followed by drying was 9.9 g/m².

The mass of the CHA-type zeolite crystallized on the support, which had been obtained from the difference between the mass of the zeolite membrane composite after fired and the mass of the support, was 122 g/m².

The membrane thickness, as obtained through SEM, was about 8 μm on average. The air permeation after firing, as measured in the same manner as in Example 1, was 570 L/(m²·hr).

FIG. 5 shows the XRD pattern of the formed zeolite membrane. In the drawing, "*" indicates the support-derived peak. The data of XRD confirm the formation of CHA-type zeolite. (Peak intensity at around 2θ=9.6°)/(peak intensity at around 2θ=20.80)=3.4, and (peak intensity at around 2θ=17.9°)/(peak intensity at around 2θ=20.80)=0.34.

As compared with that in the XRD pattern of the powdery CHA-type zeolite shown in FIG. 6, the ratio of (peak intensity at around 2θ=17.9°)/(peak intensity at around 2θ=20.80) in the XRD pattern of the zeolite membrane obtained in Example 2 was on the same level, but the ratio of (peak intensity at around 2θ=9.6°)/(peak intensity at around 2θ=20.8°) thereof was higher, from which the orientation to the plane (1,0,0) in rhombohedral setting is assumed.

The molar ratio of $SiO_2/Al_2O_3$ in the zeolite membrane was 40.2, as measured through SEM-EDX.

The water adsorption at a relative pressure of 0.8, as measured through water vapor adsorption isotherm analysis, was 2.2 times the water adsorption at a relative pressure of 0.2.

Using the CHA-type zeolite membrane composite produced in the above and in the same manner as in Example 1, the single-component gas permeation test was carried out. Thus obtained, the permeance of each gas is shown in Table 2. The permeance of carbon dioxide at 50° C. is $2.4 \times 10^{-6}$ and is a high value. The permeance of hydrogen is $1.0 \times 10^{-6}$ and is also a high value. The data indicate that the gas permeance through the zeolite membrane composite obtained here is high. The ideal separation coefficient α of carbon dioxide and methane at 50° C. is 60.

Comparative Example 1

An inorganic porous support-CHA-type zeolite membrane composite was produced through direct hydrothermal synthesis of a CHA-type zeolite on an inorganic porous support.

As a reaction mixture for hydrothermal synthesis, the following was prepared.

0.057 g of aluminium hydroxide (containing 53.5% by mass of $Al_2O_3$, by Aldrich) was added to a mixture of 30.1 g of aqueous 1 mol/L-NaOH solution and 66.0 g of water, and dissolved by stirring to give a transparent solution. As an organic template, 12.7 g of an aqueous solution of N,N,N-trimethyl-1-adamantanammonium hydroxide (TMADAOH) (containing 25% by mass of TMADAOH, by SACHEM) was added to the above, and further 23.6 g of colloidal silica (Nissan Chemical's Snowtec-40) was added thereto, and stirred for 2 hours to give an aqueous reaction mixture. The composition (ratio by mol) of the reaction mixture is $SiO_2/Al_2O_3/NaOH/KOH/H_2O/TMADAOH=1/0.002/0.2/0/44/0.1$, and $SiO_2/Al_2O_3=500$.

As an inorganic porous support, a mullite tube PM by Nikkato (outer diameter 12 mm, inner diameter 9 mm) was cut into a length of 80 mm, then the outer surface thereof was smoothed with water-resistant abrasive paper, washed with an ultrasonic washing machine and dried before use here. Prior to hydrothermal synthesis thereon, the support was processed as follows. According to the same dipping method as above, a CHA-type zeolite seed crystal was prepared to have a gel composition of $SiO_2/Al_2O_3/NaOH/H_2O/TMADAOH=1/0.033/0.1/40/0.1$ and to have a grain size of 0.5 μm or so through hydrothermal synthesis for crystallization at 160° C. for 2 days. Thus prepared, the seed crystal was adhered to the support. The mass of the thus-adhering seed crystal was about 3 g/m².

In the same manner as in Example 1, the support to which the seed crystal had been adhered was dipped in the reaction mixture put in a Teflon®-made inner cylinder, in the vertical direction therein, and the autoclave was sealed up, heated at 160° C. for 48 hours under autogenous pressure, then washed and dried. The mass of the CHA-type zeolite crystallized on the support, which was obtained from the difference between the mass of the membrane composite after fired and the mass of the support, was 109 g/m².

As measured in the same manner as in Example 1, the air permeation through the fired zeolite membrane composite was 542 L/(m²·hr).

XRD of the formed membrane confirmed the formation of CHA-type zeolite therein. In the XRD pattern of the formed membrane, (peak intensity at around 2θ=9.6°)/(peak intensity at around 2θ=20.8°)=1.7, and (peak intensity at around 2θ=17.9°)/(peak intensity at around 2θ=20.80)=0.3.

As in the above, the XRD peaks of the formed membrane did not show any specific intensity. From this, for example, it is assumed that the formed membrane would not have any orientation to the plane (1,0,0) and the plane (1,1,1) in rhombohedral setting.

In SEM-EDX of the zeolite membrane, the molar ratio of $SiO_2/Al_2O_3$ did not give any accurate value. In SEM-EDX of a zeolite membrane, in general, the detection limit of the molar ratio of $SiO_2/Al_2O_3$ is considered to be 100 or so, and accordingly, it is assumed that the molar ratio of $SiO_2/Al_2O_3$ in the zeolite membrane formed here would be more than 100.

The water adsorption at a relative pressure of 0.8, as measured through water vapor adsorption isotherm analysis, was 1.9 times the water adsorption at a relative pressure of 0.2.

Using the CHA-type zeolite membrane composite produced in the above and in the same manner as in Example 1, the single-component gas permeation test was carried out. Thus obtained, the permeance of each gas is shown in Table 3. The permeance of carbon dioxide at 50° C. is $7.8 \times 10^{-7}$ and the permeance of hydrogen is $7.52 \times 10^{-6}$. The ideal separation coefficient α of carbon dioxide and methane at 50° C. is 6.1. It is considered that a dense membrane could not be formed without any orientation therein, and therefore the separation performance of the membrane would be low. In addition, it is considered that, since the membrane is not dense, gas could pass through the defects therein and the permeance through the membrane could be on a relatively high level.

TABLE 3

| Gas | Permeance (mol/(m² · sec · Pa)) | |
| --- | --- | --- |
| | 50° C. | 140° C. |
| $H_2$ | $7.52 \times 10^{-7}$ | $6.33 \times 10^{-7}$ |
| $CH_4$ | $1.28 \times 10^{-7}$ | $1.24 \times 10^{-7}$ |
| $N_2$ | $1.82 \times 10^{-7}$ | $1.36 \times 10^{-7}$ |
| He | $4.14 \times 10^{-7}$ | $3.96 \times 10^{-7}$ |
| $CO_2$ | $7.83 \times 10^{-7}$ | $3.75 \times 10^{-7}$ |

Example 3

An inorganic porous support-CHA-type zeolite membrane composite obtained according to the same method as in Example 1 was silylated in the manner mentioned below.

The zeolite membrane composite was put in a Teflon®-made inner cylinder, as dipped in 121.5 g of desalted water, 2.5 g of tetraethoxysilane and 13.5 g of 1 M sulfuric acid in the vertical direction therein, then the autoclave was sealed up, and heated at 100° C. for 20 hours under autogenous pressure. After a predetermined period of time, this was left cooled and the zeolite membrane composite was taken out and washed with desalted water.

Using the silylated zeolite membrane composite, water was selectively separated through vapor permeation from a mixed solution of water/acetic acid (15/85 wt %). The inorganic porous support-CHA-type zeolite membrane composite was set in a thermostat bath at 130° C., and the mixed solution of water/acetic acid was fed into a vaporizer at a flow rate of 0.8 cm³/min, wholly vaporized therein and applied to the inorganic porous support-CHA-type zeolite membrane composite.

After 5 hours, the permeation result was as follows. The permeation flux was 1.4 kg/m²/hr; the separation coefficient was 900, and the water concentration in the permeated liquid was 99.38% by mass. The water permeance is $5.8 \times 10^{-7}$ mol/m²/sec/Pa. From the result, it is understood that the zeolite membrane composite of the invention has a high water permeance and has a high separation coefficient.

Example 4

An inorganic porous support-CHA-type zeolite membrane composite was produced through direct hydrothermal synthesis of a CHA-type aluminosilicate zeolite on an inorganic porous support, as described below.

As a reaction mixture for hydrothermal synthesis, the following was prepared.

114 g of water was added to a mixture of 1.24 g of aqueous 1 mol/L-NaOH solution, 4.98 g of aqueous 1 mol/L-KOH solution and 0.104 g of aluminium hydroxide (containing 53.5% by mass of $Al_2O_3$, by Aldrich) and dissolved by stirring to give a transparent solution. As an organic template, 2.44 g of an aqueous solution of N,N,N-trimethyl-1-adamantanammonium hydroxide (hereinafter this is referred to as "TMADAOH") (containing 25% by mass of TMADAOH, by SACHEM) was added to the above, and further 10.8 g of colloidal silica (Nissan Chemical's Snowtec-40) was added thereto, and stirred for 2 hours to give a aqueous reaction mixture.

The composition (ratio by mol) of the reaction mixture is $SiO_2/Al_2O_3/NaOH/KOH/H_2O/TMADAOH=1/0.0077/0.017/0.069/100/0.04$, and $SiO_2/Al_2O_3=130$.

As an inorganic porous support, a porous alumina tube (outer diameter 12 mm, inner diameter 9 mm) was cut into a length of 400 mm, and the powder formed during cutting was removed by applying compressed air thereto before use herein. Prior to hydrothermal synthesis thereon, a seed crystal was adhered to the support. According to the same method as above, a CHA-type zeolite seed crystal was prepared to have a gel composition of $SiO_2/Al_2O_3/NaOH/KOH/H_2O/TMADAOH=1/0.033/0.1/0.06/40/0.07$ and to have a grain size of 0.5 μm or so through hydrothermal synthesis for crystallization at 160° C. for 2 hours.

The seed crystal was dispersed in desalted water at about 1% by mass, in which the support was dipped for a predetermined period of time, and then dried at 100° C. for 4 hours or more to thereby make the seed crystal adhere to the support. The adhering amount of the seed crystal after drying was 1.4 g/m².

In the same manner as in Example 1, the support to which the seed crystal had been adhered was dipped in the reaction mixture put in a Teflon®-made inner cylinder, in the vertical direction therein, and the autoclave was sealed up, heated at 160° C. for 48 hours under autogenous pressure, then washed and dried. The mass of the CHA-type zeolite crystallized on the support, which was obtained from the difference between the mass of the zeolite membrane composite after fired and the mass of the support, was 46 g/m².

As measured in the same manner as in Example 1, the air permeation through the fired zeolite membrane composite was 315 L/(m²·hr).

FIG. 7 shows the XRD pattern of the formed zeolite membrane. In the drawing, "*" indicates the support-derived peak. The data of XRD confirm the formation of CHA-type zeolite. (Peak intensity at around 2θ=9.6°)/(peak intensity at around 2θ=20.8°)=3.8, and (peak intensity at around 2θ=17.9°)/(peak intensity at around 2θ=20.8°)=0.45. As compared with that in the XRD pattern of the powdery CHA-type zeolite shown in FIG. 6, the ratio of (peak intensity at around 2θ=17.9°)/(peak intensity at around 2θ=20.8°) in the XRD pattern of the zeolite membrane obtained in Example 4 was on the same level, but the ratio of (peak intensity at around 2θ=9.6°)/(peak intensity at around 2θ=20.8°) thereof was higher, from which the orientation to the plane (1,0,0) in rhombohedral setting is assumed.

The water adsorption at a relative pressure of 0.8, as measured through water vapor adsorption isotherm analysis, was 2.3 times the water adsorption at a relative pressure of 0.2.

Using the CHA-type zeolite membrane composite produced in the above and in the same manner as in Example 1, the single-component gas permeation test was carried out. Thus obtained, the permeance of each gas is shown in Table 4. The permeance of carbon dioxide at 50° C. is $2.0 \times 10^{-6}$ and is a high value. The permeance of hydrogen is $6.6 \times 10^{-7}$ and is also a high value. The data indicate that the gas permeance through the zeolite membrane composite obtained here is high. The ideal separation coefficient α of carbon dioxide and methane at 50° C. is 126, which also indicates that the zeolite membrane composite obtained here has high separation performance.

TABLE 4

| Gas | Permeance (mol/(m² · sec · Pa)) | |
|---|---|---|
| | 50° C. | 140° C. |
| $H_2$ | $6.65 \times 10^{-7}$ | $4.97 \times 10^{-7}$ |
| $CH_4$ | $1.60 \times 10^{-8}$ | $1.52 \times 10^{-8}$ |
| $N_2$ | $1.13 \times 10^{-7}$ | $6.18 \times 10^{-8}$ |
| He | $2.46 \times 10^{-7}$ | $2.34 \times 10^{-7}$ |
| $CO_2$ | $2.01 \times 10^{-6}$ | $6.17 \times 10^{-7}$ |

Comparative Example 2

An inorganic porous support-CHA-type zeolite membrane composite was produced in the same manner as in Example 1, except that the amount of aluminium hydroxide (containing 53.5% by mass of $Al_2O_3$, by Aldrich) to be added was changed to 0.503 and the composition (molar ratio) of the reaction mixture was changed to $SiO_2/Al_2O_3/NaOH/KOH/H_2O/TMADAOH=1/0.033/0.15/0.1/100/0.04$, and $SiO_2/Al_2O_3=30$. The mass increase after adhesion of the seed crystal followed by drying was 9.1 g/m².

The mass of the CHA-type zeolite crystallized on the support, which had been obtained from the difference between the mass of the zeolite membrane composite after fired and the mass of the support, was 126 g/m². The air permeation after firing, as measured in the same manner as in Example 1, was 121 L/(m²·hr).

The data of XRD of the formed membrane confirm the formation of CHA-type zeolite. In the XRD pattern of the formed membrane, (peak intensity at around 2θ=9.6°)/(peak intensity at around 2θ=20.8°)=3.2, and (peak intensity at around 2θ=17.9°)/(peak intensity at around 2θ=20.8°)=1.5. As compared with that in the XRD pattern of the powdery CHA-type zeolite shown in FIG. 6, the ratio of (peak intensity at around 2θ=17.9°)/(peak intensity at around 2θ=20.8°) in the XRD pattern of the zeolite membrane obtained in Comparative Example 2 was sufficiently high, from which the orientation to the plane (1,1,1) in rhombohedral setting is assumed.

Using the CHA-type zeolite membrane composite produced in the above and in the same manner as in Example 1, the single-component gas permeation test was carried out. Thus obtained, the permeance of each gas is shown in Table 5. The permeance of carbon dioxide at 50° C. is $7.5 \times 10^{-7}$, and the permeance of hydrogen is $1.0 \times 10^{-6}$. The ideal separation coefficient αc of carbon dioxide and methane at 50° C. is 88. It is considered that the separation performance of the membrane composite could be high in some degree owing to orientation to the plane (1,1,1), but on the other hand, the permeance through the membrane composite is low.

TABLE 5

| Gas | Permeance (mol/(m² · sec · Pa)) | |
|---|---|---|
| | 50° C. | 140° C. |
| $H_2$ | $3.32 \times 10^{-7}$ | $2.60 \times 10^{-7}$ |
| $CH_4$ | $8.49 \times 10^{-9}$ | $1.11 \times 10^{-8}$ |
| $N_2$ | $5.65 \times 10^{-8}$ | $3.37 \times 10^{-8}$ |
| He | $1.32 \times 10^{-7}$ | $1.29 \times 10^{-7}$ |
| $CO_2$ | $7.50 \times 10^{-7}$ | $2.45 \times 10^{-7}$ |

While the present invention has been described in detail and with reference to specific embodiments thereof, it will be apparent to one skilled in the art that various changes and modifications can be made therein without departing from the spirit and scope thereof. The present application is based upon a Japanese patent application filed Feb. 24, 2012 (Patent Application 2012-039272) and a Japanese patent application filed Aug. 31, 2012 (Patent Application 2012-192013), the contents of which are incorporated herein by reference.

INDUSTRIAL APPLICABILITY

The invention is usable in any industrial field, and is especially preferred for use in the field that requires separation of vapor mixture (gas), for example, in chemical industry plants, purification plants for natural gas, plants of generating biogas from garbage and the like, and for use in the field that requires separation of water from water-containing organic compounds and recovery of organic compounds, for example, in chemical industry plants, fermentation plants, factories for precision electronic components, cell production factories, etc.

REFERENCE SIGNS LIST

1 Zeolite Membrane Composite
2 Pressure-tight Container
3 End Pin
4 Connection
5 Pressure Gauge
6 Back Pressure Valve
7 Supply Gas
8 Permeated Gas
9 Sweep Gas
10 Discharged Gas
11 Permeated Gas Discharging Duct
12 Sweep Gas Introducing Duct
13 Liquid to be Separated
14 Feeding Pump
15 Vaporizer
16 Thermostat Bath
17 Zeolite Membrane Composite Module
18 Collecting Trap of Liquid to be Separated
19 Permeated Liquid Collecting Trap
20 Cold Trap
21 Vacuum Pump

The invention claimed is:

1. A zeolite membrane composite comprising:
an inorganic porous support and
a zeolite membrane positioned on the inorganic porous support,
wherein the inorganic porous support is alumina,
wherein the zeolite membrane comprises zeolite of a CHA-type aluminosilicate having a molar ratio of $SiO_2/Al_2O_3$ (SAR) of from 30 to 100,
wherein the SAR is determined by scanning electron microscope-energy dispersive X-ray spectroscopy (SEM-EDX),
wherein in an X-ray diffraction pattern obtained through irradiation to a surface of the zeolite membrane with X-rays, a ratio of a peak intensity at around $2\theta=17.9°$ to a peak intensity at around $2\theta=20.8°$, $2\theta$ (17.9/20.8), is 0,5 or less, and
wherein in an X-ray diffraction pattern obtained through irradiation to a surface of the zeolite membrane with X-rays, a ratio of a peak intensity at around $2\theta=9.6°$ to a peak intensity at around $2\theta=20.8°$, $2\theta$ (9.6/20.8), is from 2.0 to less than 4.0,
wherein the zeolite membrane is obtained by a process comprising:
applying an aqueous reaction mixture to the inorganic support for hydrothermal synthesis and performing hydrothermal synthesis, thereby crystalizing the zeolite on a, surface of the inorganic porous support,
wherein the aqueous reaction mixture comprises an Si element source, an Al element source, an alkali source, and water, and comprises an organic template, wherein the alkali source comprises at least potassium and sodium, wherein the organic template is a cation derived from 1-adamantanamine, and wherein a ratio of the Si element source to the Al element source, expressed as a molar ratio of $SiO_2/Al_2O_3$, in the aqueous reaction mixture is at least 40, and
wherein the aqueous reaction mixture has a molar ratio, K/(K+Na+ organic template), of at least 0.34.

2. The zeolite membrane composite according to claim 1, wherein a water adsorption f the zeolite membrane composite at a relative pressure of 0.8, as obtained from a water vapor adsorption isotherm of the zeolite membrane composite, is from 2 times to 10 times a water adsorption of the zeolite membrane composite at a relative pressure of 0,2.

3. The zeolite membrane composite according to claim 1, wherein the air permeation of the zeolite membrane composite as connected to a vacuum line under an absolute pressure of 5 kPa, is from 100 L/(m²·h) to 1000 L(m²·h).

4. The zeolite membrane composite according to claim 1, wherein the CHA-type aluminosilicate has the molar ratio of $SiO_2/Al_2O_3$(SAR) of from 32 to 100.

5. The zeolite membrane composite according to claim 1, wherein the CHA-type aluminosilicate has the molar ratio of $SiO_2/Al_2O_3$ ($_S$AR) of from 30 to 50.

6. The zeolite membrane composite according to claim 1, wherein an air permeation of the zeolite membrane composite as connected to a vacuum line under an absolute pressure of 5 kPa, is 1000 L/(m²·h) or lower.

7. The zeolite membrane composite according to claim 1, capable of separation of a gas mixture comprising multiple components.

8. The zeolite membrane composite according to claim 1, capable of separation of a vapor mixture comprising multiple components.

9. The zeolite membrane composite according to claim 1, capable of separation of a liquid mixture comprising multiple components.

10. The zeolite membrane composite according to claim 1, wherein in an X-ray diffraction pattern obtained through irradiation to a surface of the zeolite membrane with X-rays, the ratio $2\theta$ (17.9/20.8) is less than 0.5, and
wherein the zeolite has the molar ratio of $SiO_2/Al_2O_3$ of from 30 to 50.

11. The zeolite membrane composite according to claim 1, wherein a thickness of the zeolite membrane is 10 µm or less.

12. The zeolite membrane composite according to claim 1, wherein a thickness of the zeolite membrane is from 0.1 µm to 10 µm.

13. The zeolite membrane composite according to claim 1, wherein the carbon dioxide permeation performance is at least $3\times10^{-8}$ mol·(m²·s·Pa)$^{-1}$ at a temperature of 50° C. and under a differential pressure of 0098 MPa.

* * * * *